(12) United States Patent
Hitoshi

(10) Patent No.: US 6,683,410 B2
(45) Date of Patent: Jan. 27, 2004

(54) ORGANIC EL DEVICE WITH LIGHT ABSORBING PIECE AND METHOD FOR MANUFACTURING THE SAME

(75) Inventor: Yamamoto Hitoshi, Chochoo (JP)

(73) Assignee: Samsung SDI Co., Ltd., Suwon (KR)

( * ) Notice: Subject to any disclaimer, the term of this patent is extended or adjusted under 35 U.S.C. 154(b) by 89 days.

(21) Appl. No.: 09/949,232

(22) Filed: Sep. 10, 2001

(65) Prior Publication Data
US 2002/0057053 A1 May 16, 2002

(30) Foreign Application Priority Data

Sep. 20, 2000 (KR) ........................................ 2000-55250
Sep. 27, 2000 (KR) ........................................ 2000-56763
Oct. 12, 2000 (KR) ........................................ 2000-59957

(51) Int. Cl.⁷ ............................ H05B 33/00; H01J 1/62
(52) U.S. Cl. ...................... 313/506; 313/504; 313/505; 313/509
(58) Field of Search ................................. 313/500, 504, 313/505, 506, 509, 111; 257/91, 98

Primary Examiner—Vip Patel
Assistant Examiner—Glenn Zimmerman
(74) Attorney, Agent, or Firm—McGuireWoods LLP

(57) ABSTRACT

The present invention discloses an organic EL device, including first electrodes formed on a transparent substrate and spaced apart from each other in parallel, a light absorbing layer having an opening portion for exposing a portion of the first electrodes and at least one light absorbing piece arranged in the opening portion, light-emitting layers formed on the exposed portion of the first electrodes to cover the opening portion of the light absorbing layer, and second electrodes formed on the light-emitting layers in a perpendicular direction to the first electrodes.

21 Claims, 36 Drawing Sheets

230　　210　　225

235　　210　　225

ORGANIC EL DEVICE WITH LIGHT ABSORBING PIECE AND METHOD FOR MANUFACTURING THE SAME

BACKGROUND OF THE INVENTION

1. Field of the Invention

The present invention relates to an organic EL device and a method for manufacturing the same.

2. Description of Related Art

Organic EL devices are recently used in various industrial fields, for example, a back light device of a liquid crystal display (LCD) device, a portable terminal apparatus, an automobile navigator and a computer, a television, because of its rapid response speed, excellent brightness, simple structure, low production cost, light weight, etc.

The organic EL device includes first electrodes or anode electrodes formed on a substrate and second electrodes or cathode electrodes with light-emitting layers interposed therebetween.

A method for manufacturing such an organic EL device is as follows. First, an indium-tin oxide (ITO) film is formed all over a front surface of a glass substrate in a vacuum atmosphere. Then, the ITO film is formed into a stripe-like shape by etching, resulting in a plurality of transparent electrodes or first electrodes arranged side by side and spaced from each other at predetermined intervals. Then, the light-emitting layer is formed on the first electrode. The light-emitting layer includes a hole transport layer, a luminescent layer, and an electron transport layer, which are laminated in sequence and sandwiched between an anode and a cathode.

In more detail, the hole transport layer, which is made of a hole transport material such as a triphenylamine derivative (TPD) or the like, is formed on the transparent electrodes by vacuum deposition. Subsequently, a layer made of an electron transport material such as an aluminum quinolinol complex ($Alq_3$) acting as a luminous material is laminated on the hole transport layer, resulting in a luminous material layer being formed by vacuum deposition. Then, material like Al, Li, Ag, Mg, In is deposited in a stripe-like manner on the luminous material layer so as to extend in a direction perpendicular to a pattern of the transparent electrodes, thereby provide a plurality of rear electrodes or second electrodes. In such a construction, portions of the luminous material layer positioned at intersections between the transparent electrodes and the rear electrodes define luminous sections, resulting in forming a dot matrix. The organic EL device operates by flowing a current to the luminous sections positioned on the intersections between the transparent electrodes acting as anodes and the rear electrodes acting as cathodes, illuminating the luminous sections.

However, the organic EL device having such a configuration has a problem of very low contrast ratio because ambient light is reflected from the second electrode made of a metal and lowers brightness. In order to clearly observe displayed images under a condition of a standard illuminance, i.e., 500 lux, a contrast ratio of at least eight to one (8:1) is required. However, ambient light reflected from the cathode electrode is directed toward an observer. Therefore, a contrast ratio is lowered to less than eight to one, leading to a very low brightness enough not to clearly recognize displayed images.

In order to overcome the problem described above, a circular polarizer is arranged either of on a top surface and a bottom surface of the anode electrode. However, the circular polarizer lowers a transmittance of light emitted from the light-emitting layer to be less than about 50%. As a result, a brightness of the organic EL device is decreased as much as about 50%. In order to improve this low brightness problem, electrical current should be doubled because a light intensity is proportional to a current intensity. However, such an approach increases power consumption. Considering that most of the organic EL device is portable, large power consumption causes an inconvenience to users. In addition, a life span of the organic EL device is in inverse proportion to an intensity of electrical current applied. Therefore, applying more electric current shortens the life span of the organic EL device. Also, an addition of the circular polarizer also increases production costs.

Meanwhile, the anode electrode is made of indium tin oxide (ITO) and thus has relatively high resistance value of 10~20Ω. Therefore, a current loss is relatively high. Recently, in order to overcome the problem, a technique is introduced that an auxiliary electrode made of relatively low resistive metal is arranged along an edge of the ITO layer without affecting the display characteristics. However, this technique also has a problem that additional processes to form the auxiliary electrode are required, leading to a lengthy manufacturing process.

SUMMARY OF THE INVENTION

It is an object of the present invention to provide an organic EL device having a high brightness.

It is another object of the present invention to provide an organic EL device having low power consumption.

It is a still further object of the present invention to provide an organic EL device having a lengthy life span.

It is also a still further object of the present invention to provide an organic EL device having an excellent productivity.

It is also a still further object of the present invention to provide an organic EL device having a simplified manufacturing process.

In order to achieve the above object, the preferred embodiments of the present invention provide an organic EL device, including first electrodes formed on a transparent substrate and spaced apart from and parallel to each other' a light absorbing layer having an opening portion for exposing a portion of the first electrodes and at least one light absorbing piece arranged in the opening portion, light-emitting layers formed on the exposed portion of the first electrodes to cover the opening portion of the light absorbing layer, and second electrodes formed on the light-emitting layers in a perpendicular direction to the first electrodes.

The preferred embodiment of the present invention provides an organic EL device, including a transparent substrate, a light absorbing layer having a first opening portion and at least one light absorbing piece arranged in the opening portion, first electrodes covering the opening portion of the light absorbing layer and parallely spaced apart from to each other an insulating layer having a second opening portion formed at a location corresponding to the first opening portion of the light absorbing layer and at least one insulating piece formed at a location corresponding to the light absorbing piece, light-emitting layers formed on the exposed portion of the first electrodes to cover the second opening portion, and second electrodes formed on the light-emitting layer in a perpendicular direction to the first electrodes.

The preferred embodiment of the present invention provides an organic EL device, including first electrodes formed on a top surface of a first transparent substrate spaced apart from and parallel to each other, an insulating layer having a first opening portion for exposing a portion of the first electrodes and at least one insulating piece formed in the first opening portion, light-emitting layers formed on the exposed portion of the first electrodes to cover the first opening portion of the insulating layer, second electrodes formed on the light-emitting layer in a perpendicular direction to the first electrodes, and a light absorbing unit attached on a bottom surface of the transparent substrate and having a second opening portion formed at a location corresponding to the first opening portion of the insulating layer and at least one light absorbing piece formed at a location corresponding to the insulating piece of the insulating layer.

The preferred embodiment of the present invention provides a method for manufacturing an organic EL device, including steps forming on a transparent substrate first electrodes spaced apart from and parallel to each other, forming a light absorbing layer having an opening portion for exposing a portion of the first electrodes and at least one light absorbing piece arranged in the opening portion, forming light-emitting layers on the exposed portion of the first electrodes to cover the opening portion of the light absorbing layer, and forming second electrodes on the light-emitting layers in a perpendicular direction to the first electrodes 23. The method may further comprise a step of forming a metal layer on one side of the first electrodes and in a longitudinal direction of the first electrodes before the step of forming the light absorbing layer.

The preferred embodiment of the present invention provides a method for manufacturing an organic EL device, including forming a transparent substrate, forming a light absorbing layer having a first opening portion and at least one light absorbing piece arranged in the opening portion, forming first electrodes spaced apart from and parallel to each other for covering the opening portion of the light absorbing layer, forming an insulating layer having a second opening portion arranged at a location corresponding to the first opening portion of the light absorbing layer and at least one insulating piece, arranged at a location corresponding to the light absorbing piece; forming light-emitting layers on the exposed portion of the first electrodes to cover the second opening portion, and forming second electrodes on the light-emitting layer in a perpendicular direction to the first electrodes.

The preferred embodiment of the present invention provides a method for manufacturing an organic EL device, including steps of forming first electrodes spaced apart from and parallel to each other on a top surface of a first transparent substrate and forming an insulating layer having a first opening portion for exposing a portion of the first electrodes and at least one insulating piece formed in the first opening portion, forming light-emitting layers on the exposed portion of the first electrodes to cover the first opening portion of the insulating layer, forming second electrodes on the light-emitting layer in a perpendicular direction to the first electrodes, and attaching a light absorbing unit on a bottom surface of the transparent substrate, the light absorbing unit having a second opening portion formed at a location corresponding to the first opening portion of the insulating layer and at least one light absorbing piece formed at a location corresponding to the insulating piece of the insulating layer.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts.

DETAILED DESCRIPTION OF PREFERRED EMBODIMENTS

Reference will now be made in detail to preferred embodiments of the present invention, example of which is illustrated in the accompanying drawings.

First Preferred Embodiment

Figure 1A:
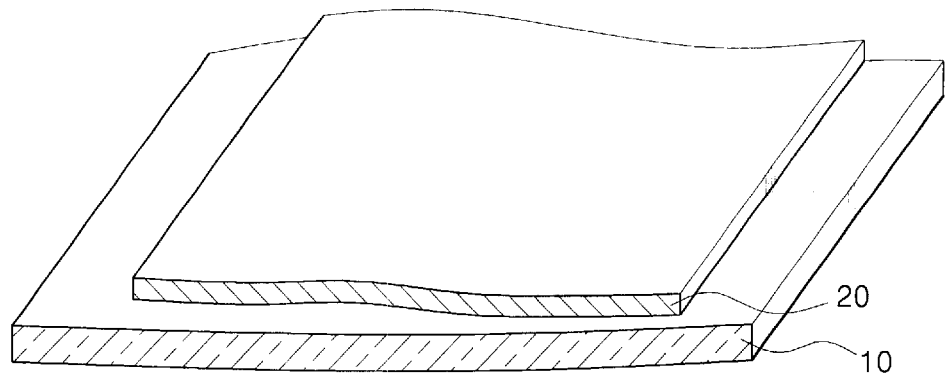
FIGS. 1A, 1B, 1C, 1D, 1E, 1F, 1G and 1H are schematic diagrams illustrating processes of manufacturing an organic EL device according to a first preferred embodiment of the present invention.
Figure 1B:
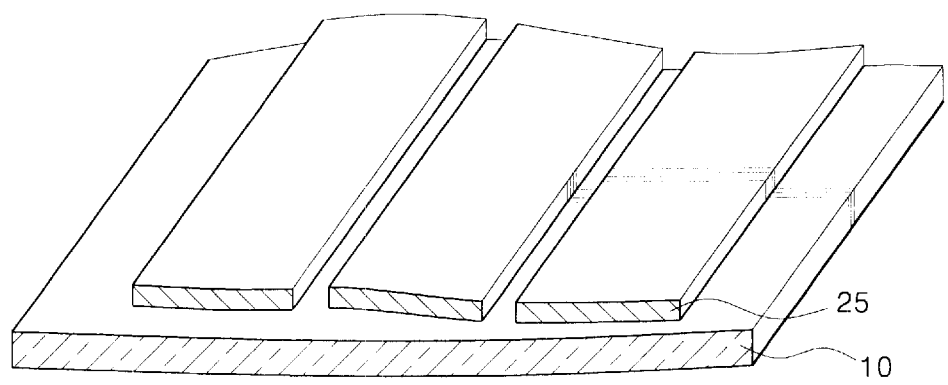

FIGS. 1A through 1H illustrate the process of manufacturing an organic EL device according to the first preferred embodiment of the present invention. First, as shown in FIG. 1A, a transparent conductive material layer 20 is deposited about 1000 Å thick on the whole surface of a transparent substrate 10. Preferably, the transparent conductive material layer is made of an indium tin oxide (hereinafter referred to as simply "ITO") or indium zinc oxide (hereinafter referred to as simply "IZO"). Then, even though not shown, a photoresist layer is coated on the transparent conductive material layer 20 to a predetermined thickness using a spin coating method. A pattern mask having a chromium layer of a stripe shape that does not pass light through is aligned with the photoresist layer. The photoresist layer is subject to light exposure to form stripe-shaped photoresist patterns. At this moment, portions of the photoresist layer not exposed to light due to the chromium patterns remains, and the remaining portions are removed by a chemical reaction with light. The transparent conductive material layer 20 having the photoresist patterns formed thereon is etched using either a dry etching technique and a wet etching technique. All portions of the ITO layer 20 except portions covered by the photoresist patterns are removed. As a result, as shown in FIG. 1B, anode electrodes 25 are formed.

At this point, the anode electrode 25 is a type of the oxide film that electrical resistance is low, but has a lower conductivity than a metal. And, the anode electrode 25 has a high transmittance. In order to improve such an electrical property, the anode electrode includes an auxiliary electrode made of a metal. An auxiliary electrode is optional.

Figure 1C:
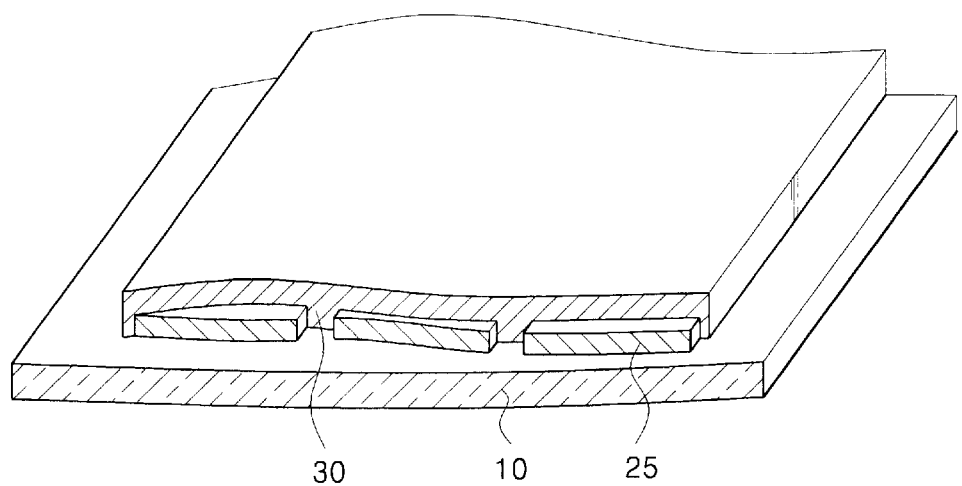
Figure 1D:
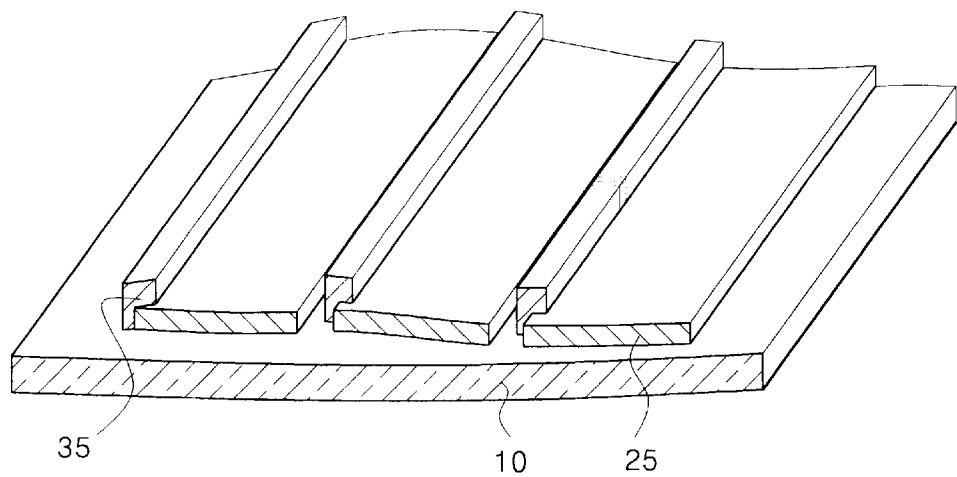

A process of forming the auxiliary electrode is shown in FIGS. 1C and 1D. As shown in FIG. 1C, a metal layer 30 is deposited over the whole surface of the substrate 10 while covering the anode electrodes 25 using the sputtering technique. Thereafter, through the photolithography process, as shown in FIG. 1D, the metal layer 30 is patterned to form the auxiliary electrodes 35 on one side of the anode electrode 25 in a longitudinal direction.

Figure 1E:
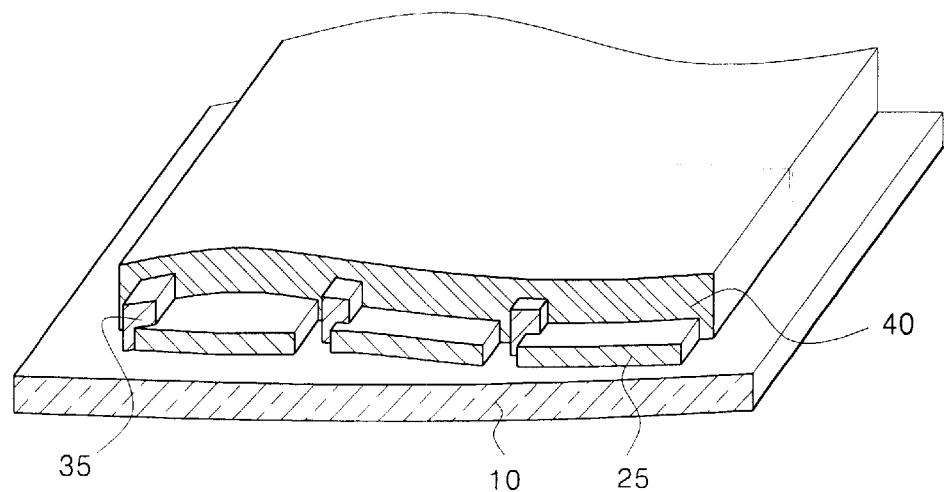

Subsequently, as shown in FIG. 1E, a light absorbing material layer 40 is formed over the whole surface of the substrate 10 while covering the anode electrodes 25 and the auxiliary electrodes 35 using the spin coating technique. The light absorbing material layer 40 is made of a non-conductive black resin to absorb ambient light, thereby lowering power consumption.

Figure 2A:
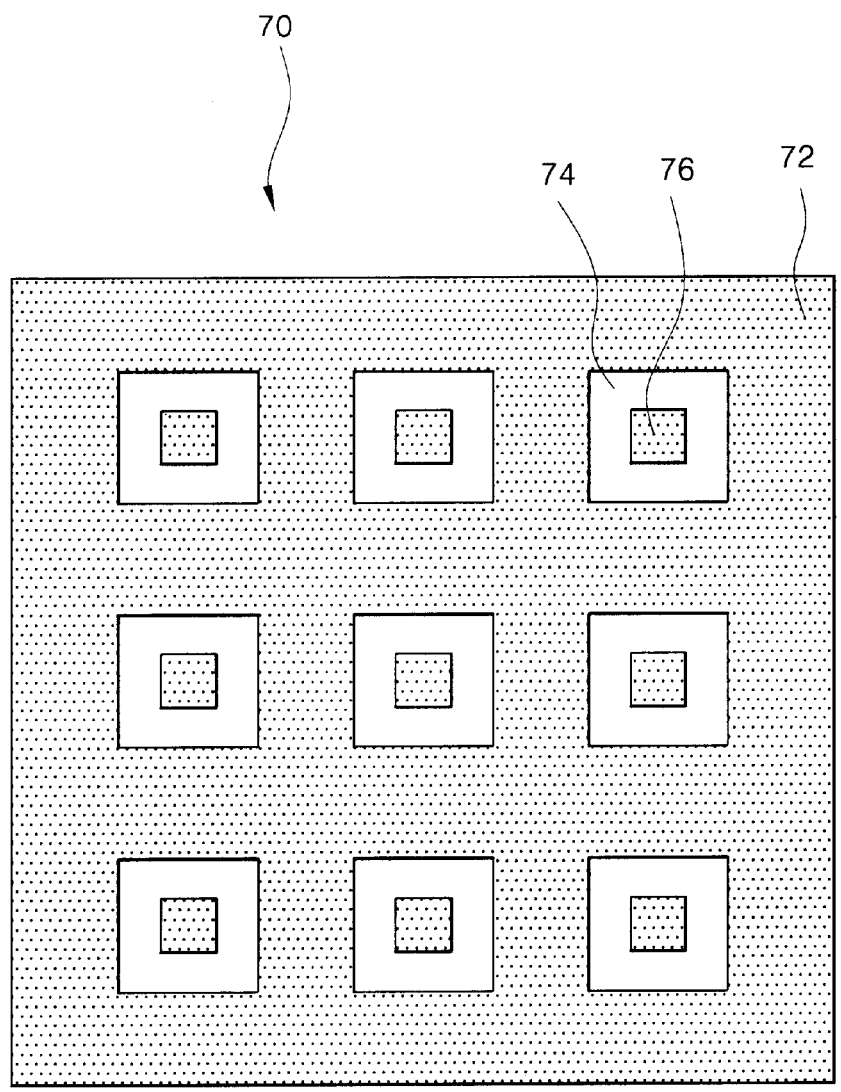
FIG. 2A is a plan view illustrating an embodiment of a pattern mask according to the present invention.
Figure 3A:
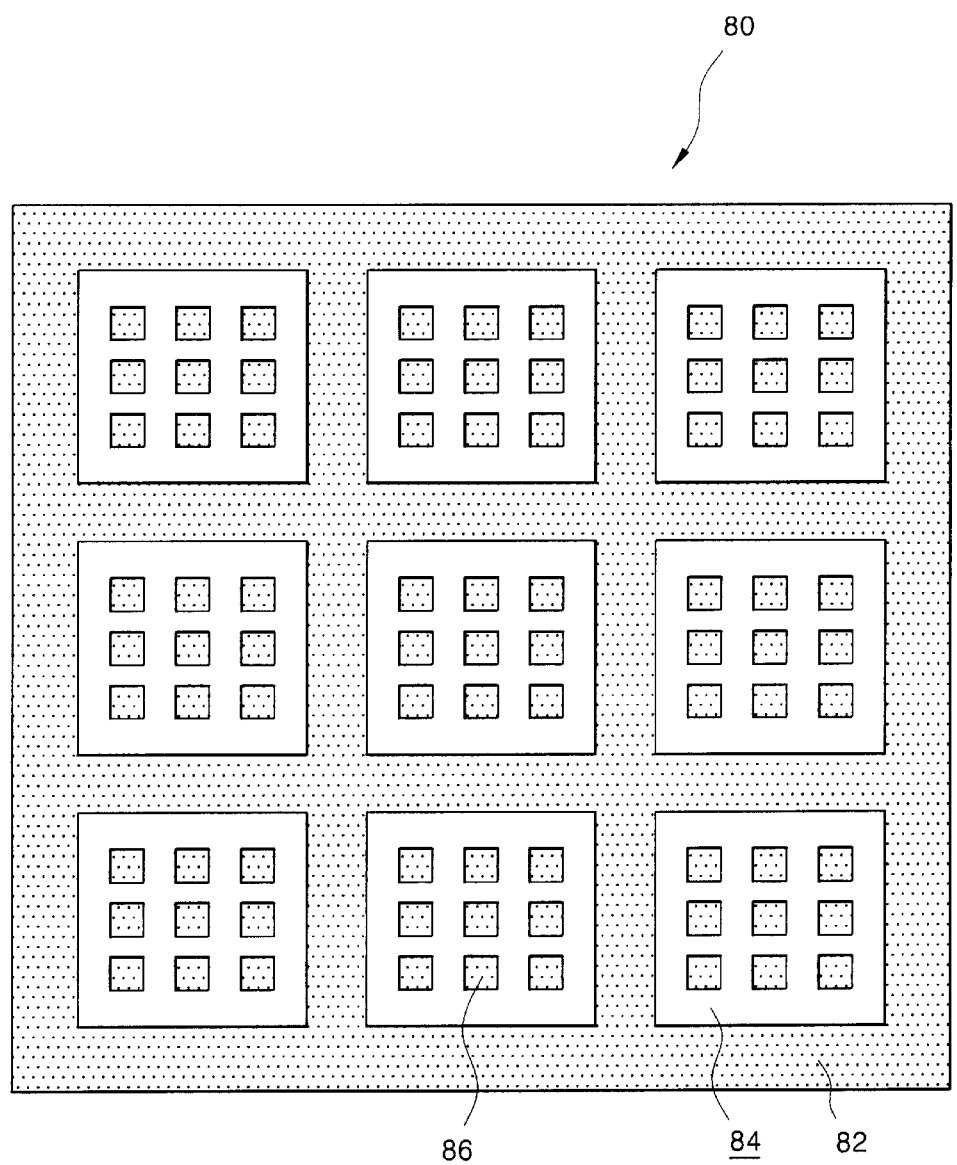
FIG. 3A is a plan view illustrating another embodiment of a pattern mask according to the present invention.

Then, a photoresist layer is coated on the light absorbing material layer 40 and is patterned to form photoresist patterns using a pattern mask. FIGS. 2A and 3A show two pattern masks. In FIG. 2A, the pattern mask 70 includes a light shielding portions 72 and 76 and a light transmitting portion 74. The light transmitting portion 74 has a rectangular frame shape or a doughnut shape but its shape is not limited to the present invention. In other words, the pattern mask 70 has one light shielding piece 76 in the light transmitting portion 74. In FIG. 3A, the pattern mask 80 includes a light shielding portions 82 and 86 and a light transmitting portion 84. The light transmitting portion 84 has a grid shape but its shape is not limited to the present invention. In other words, the pattern mask 80 has at least two light shielding pieces 86 in the light transmitting portion 84. The pattern masks 70 and 80 are formed by depositing a chromium layer on the whole surface of a transparent glass substrate and then patterning the chromium layer to have the light shielding portions and the light transmitting portions.

Figure 1F:
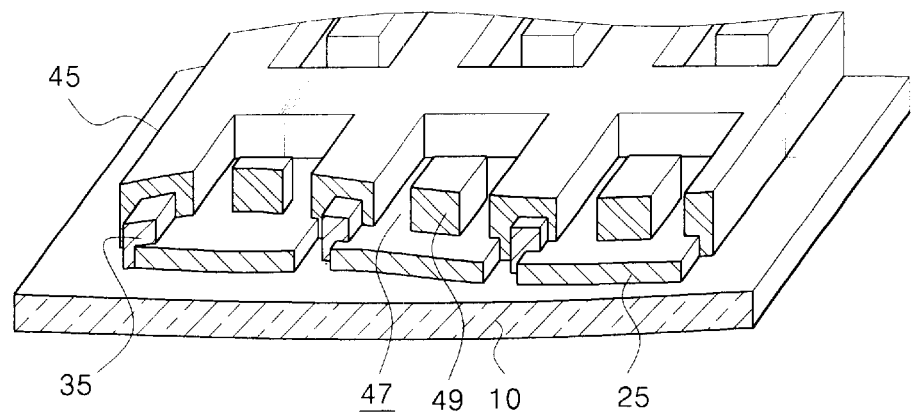
Figure 2B:
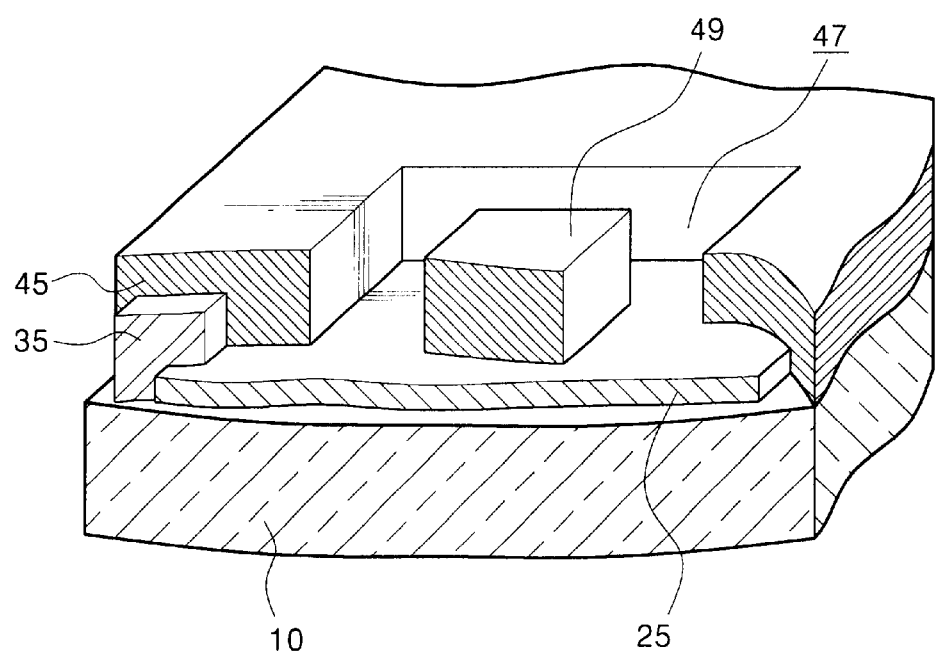
FIG. 2B is a perspective view illustrating a light absorbing layer formed using the pattern mask of FIG. 2A.

According to the photoresist patterns formed by the pattern mask 70 or 80, the light absorbing material layer 40 is patterned to form a light absorbing layer 45 as shown in FIG. 1F. At this point, a portion of the light absorbing layer 40 corresponding to the light transmitting portion is removed, while a portion of the light absorbing layer 40 corresponding to the light shielding portions remains. When the pattern mask 70 is used, the light absorbing layer 45 of FIG. 2B having an opening portion 47 and a light absorbing piece 49 is formed. When the pattern mask 80 is used, the light absorbing layer 45' of FIG. 3B having an opening portion 47' of a grid shape and two or more light absorbing pieces 49' are formed. The opening portions are formed at a location corresponding to the light transmitting portion, and the light absorbing pieces are formed at a location corresponding to the light shielding portion. Also, the opening portions are formed at a location corresponding to light-emitting layers that will be formed in subsequent process. A shape of the opening portion and of the light absorbing piece is not limited to those described here. Preferably, an aperture ratio of the anode electrode 25 is about 18%. That is, of an area of the upper surface of the anode electrode 25, about 18% are exposed.

Figure 1G:
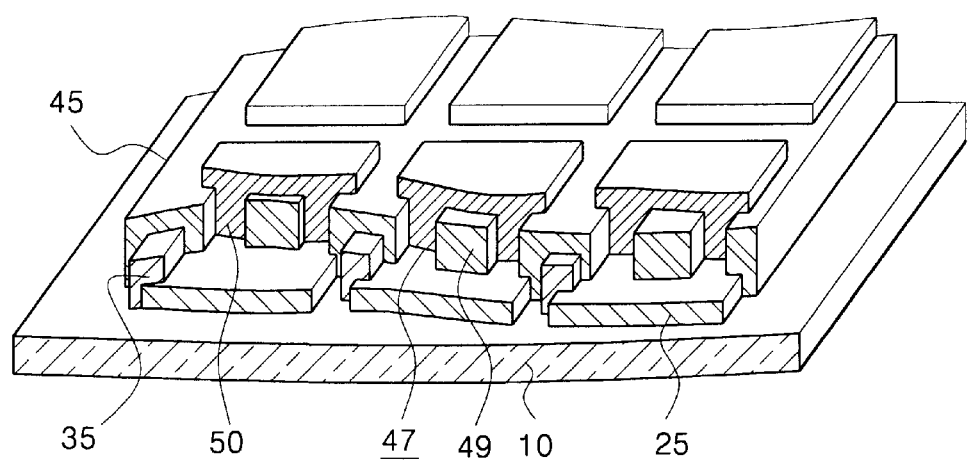

Subsequently, as shown in FIG. 1G, light-emitting layers 50 are formed on the exposed portion of the anode electrode 25 while covering the opening portions 47 of the light absorbing layer 45 using a pattern mask. The light-emitting layers 50 include a hole transport layer, a luminescent layer, and an electron transport layer, which layers are laminated in sequence.

Figure 1H:
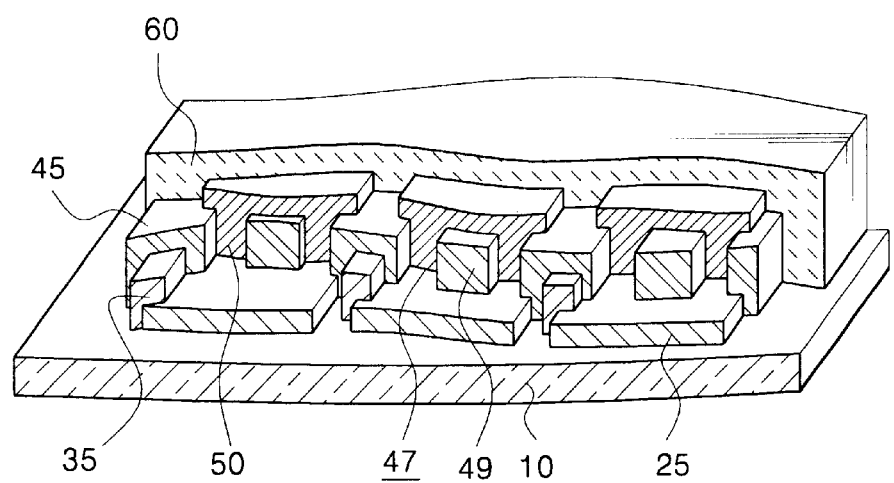

Then, as shown in FIG. 1H, cathode electrodes 60 are formed on the light-emitting layers 50, preventing the adjacent two light-emitting layers 50 from being short-circuited. Therefore, most components of the organic EL device according to the first preferred embodiment of the present invention are completed.

Of components of the organic EL device described above, the non-conductive light absorbing layer 45 minimizes a reflection of ambient light from the cathode electrode while not permitting the emission of light at a location corresponding to the light absorbing layer 45, leading to high brightness and low power consumption because it is interposed between the anode electrode 25 and the cathode electrode 60.

Meanwhile, in order to selectively improve the contrast ratio, an anti-reflection coating layer may additionally be arranged to disperse light in connection with an outside of the substrate 10 or the anode electrode 25.

Table 1 listed below shows brightness of a variety of organic EL devices.

TABLE 1

| | | Contrast Ratio | | | |
|---|---|---|---|---|---|
| | Reflectance (%) | Room (165 lux) | Office (325 lux) | Shade (1200 lux) | Standard (500 lux) |
| Experimentation 1 | 20.7% | 38.8 | 20.6 | 14.2 | 7.0 |
| Experimentation 2 | 16.7% | 56.6 | 25.2 | 17.0 | 8.1 |
| Comparison Example 1 | 60% | 14.6 | 8.4 | 6.2 | 3.8 |
| Comparison example 2 | 4% | 192.4 | 98.6 | 64.8 | 28.2 |

The organic EL device of Experimentation 1 has a structure that the light absorbing layer is formed between the anode electrode and the cathode electrode with a predetermined aperture ratio. The organic EL device of Experimentation 2 has a structure that both the light absorbing layer and the anti-reflection coating layer are formed between the anode electrode and the cathode electrode with a predetermined aperture ratio. The organic EL device of Comparison example 1 has neither the light absorbing layer nor the anti-reflection coating layer. The organic EL device of Comparison example 2 has the circular polarizer.

The contrast ratio is obtained by the following equation:

$$\text{Contrast Ratio} = \frac{\text{Illuminance of Darkroom}}{\frac{\text{Illuminance} \times \text{Reflectance}}{\pi}} + 1 \quad \text{Equation (1)}$$

In Equation 1, a reflectance is measured under light of 550 nm using a spectrophotometer in percentage that ambient light is reflected from the organic EL device, and an illuminance is one of an atmosphere where the experimentation is performed (i.e., a room, an office and a shady place). In Table 1, a reflectance of Experimentation 1 is 20.7%, and one of Experimentation 2 is 16.7%, and one of Comparison example 1 is 60%, and one of Comparison example 2 is 4%.

As shown in Table 1, it is understood that the illuminance is in reverse proportion to the reflectance. In further detail, under a condition that an illuminance is 325 lux (ie., at office atmosphere), the organic EL device of Experimentation 1 has a contrast ratio of about 20.6:1, and the organic EL device of Experimentation 2 has a contrast ratio of about 25.2:1, and the organic EL device of Comparison example 1 has a contrast ratio of about 8.4:1, and the organic EL device of Comparison example 2 has a contrast ratio of about 98.6:1. In other words, in an office where the illuminance is 325 lux, due to very high reflectance of 60%, the organic EL device of Comparison example 1 has such low contrast ratio of 8.4:1 as can lower significantly its display performance compared with those of Experimentations 1 and 2 and Comparison example 2.

Table 2 shows power consumption of the organic EL devices of Experimentations 1 and 2 and Comparison example 2 on the basis of that of Comparison example 1.

TABLE 2

Power Consumption

| Experimentation 1 | 100% |
| Experimentation 2 | 100% |
| Comparison Example 1 | 100% |
| Comparison Example 1 | 233% |

As shown in Table 2, all the organic EL devices of Experimentations 1 and 2 and Comparison example 1 require the almost same power consumption, while only the organic EL devices of Comparison example 2 require very high power consumption of about 233%. This is because the organic EL device of Comparison example 2 having the circular polarizer requires a large amount of electric current to implement high brightness as described above.

As described herein before, the organic EL device having only the light absorbing layer and the organic EL device having both the light absorbing layer and the anti-reflection coating layer have high brightness and low power consumption. On the other hand, the conventional organic EL device having the circular polarizer has a disadvantage when used in a portable display device because of high power consumption.

Second Preferred Embodiment

Figure 3B:
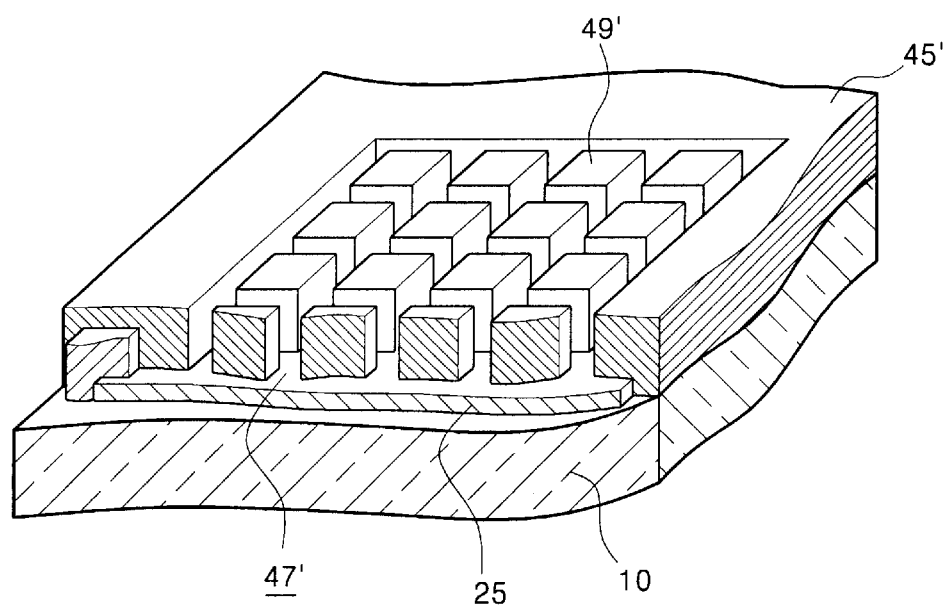
FIG. 3B is a perspective view illustrating a light absorbing layer formed using the pattern mask of FIG. 3A.
Figure 4A:
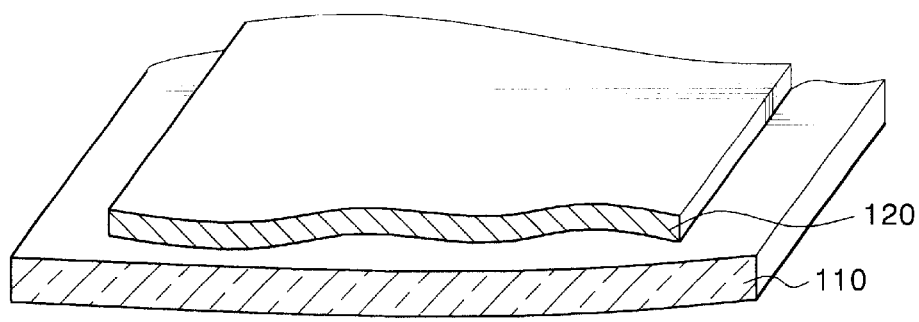
FIGS. 4A, 4B, 4C, 4D, 4E, 4F, 4G, 4H, 4I and 4J are schematic diagrams illustrating a process of manufacturing an organic EL device according to a second preferred embodiment of the present invention.
Figure 4B:
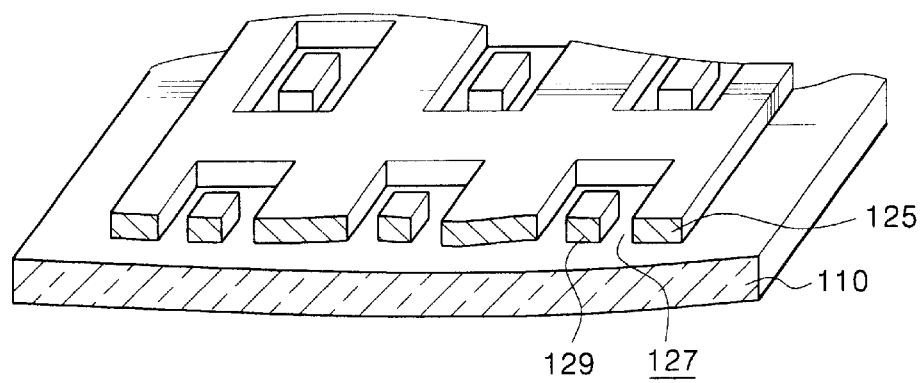

FIGS. 4A through 4J are schematic diagrams illustrating a process of manufacturing an organic EL device according to a second preferred embodiment of the present invention. First, as shown in FIG. 4A, a light absorbing material layer 120 is deposited on an upper surface of a transparent glass substrate 110 to a predetermined thickness. The light absorbing material layer 120 is made of a nonconductive material and preferably a non-conductive black resin. As shown in FIG. 4B, the light absorbing material layer 120 is patterned to form a light absorbing layer 125 using either of the pattern masks 70 and 80 of FIGS. 2A and 2B. Therefore, the light absorbing layer 125 has the same shape of FIGS. 2B and 3B. In other words, FIG. 4B shows the light absorbing layer 125 having one light absorbing piece 129 in an opening portion 127, but the light absorbing layer may include two or more light absorbing pieces as shown in FIG. 3B.

Figure 4C:
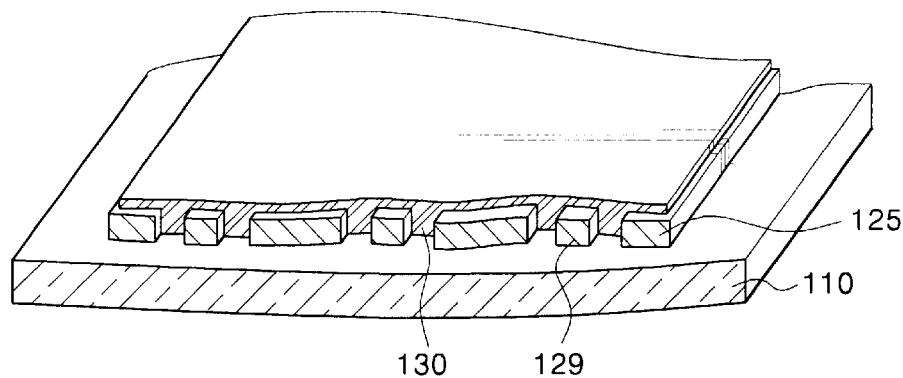
Figure 4D:
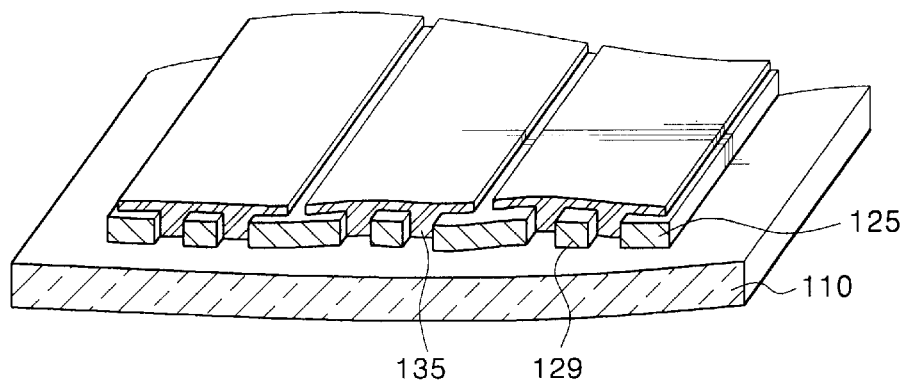

Subsequently, as shown in FIG. 4C, a transparent conductive material layer 130 is deposited over the whole surface of the substrate 110 while covering the light absorbing layer 125. The transparent conductive material layer 130 is etched in the form of a stripe to form anode electrodes 135 as shown in FIG. 4D. Preferably, the transparent conductive material layer 130 is made of ITO or IZO. At this point, the anode electrodes 135 are formed on the light absorbing layer 120 spaced apart from and parallel to each other.

Figure 4E:
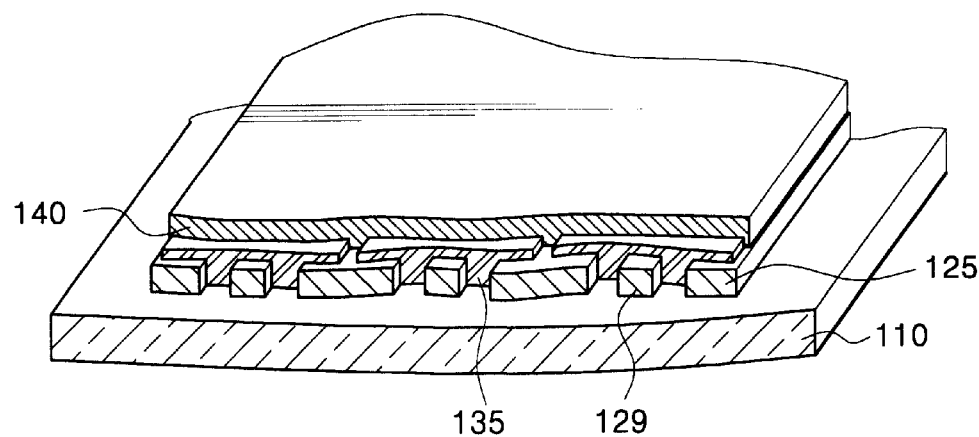
Figure 4F:
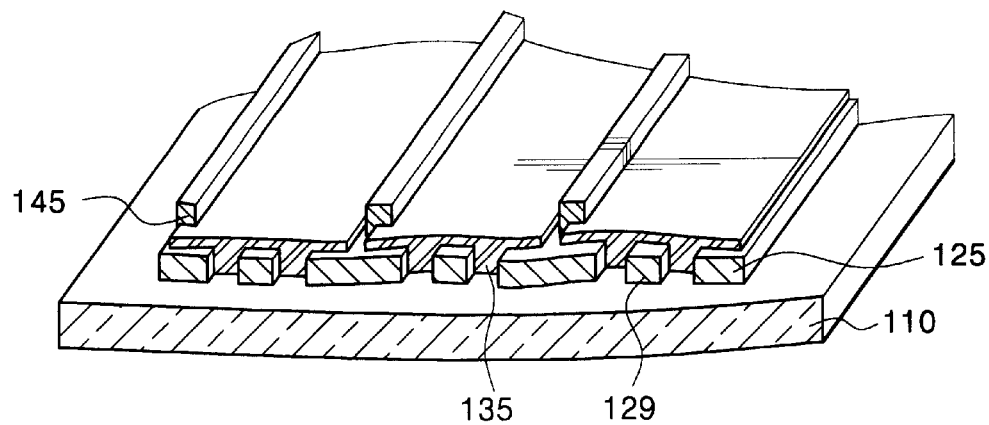

Then, as shown in FIG. 4E, a metal layer 140 is deposited on the anode electrodes 135 to a predetermined thickness through a metal deposition process. The metal layer 140 is patterned to form auxiliary electrodes 145 on one side of and in a longitudinal direction of the anode electrode 135 to support the anode electrodes 135 as shown in FIG. 4F.

Figure 4G:
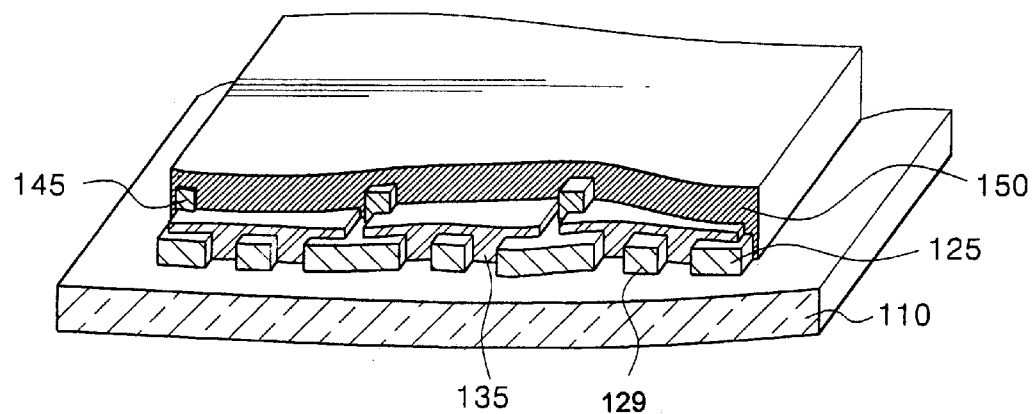
Figure 4H:
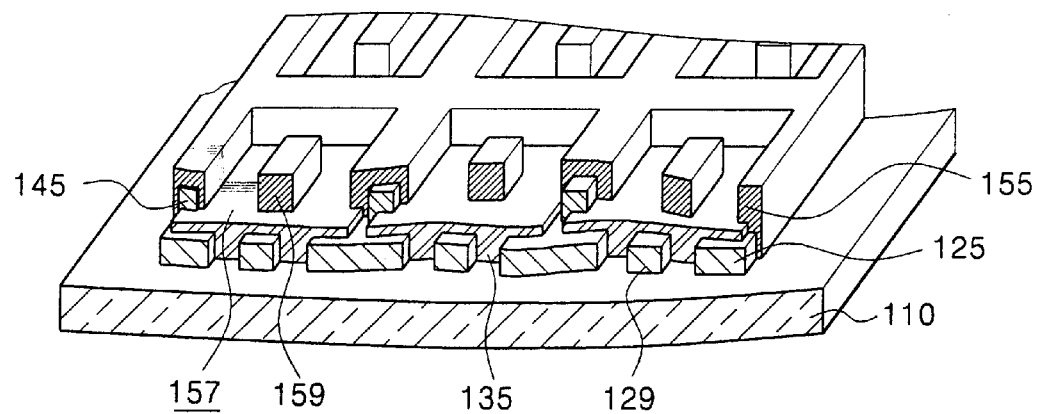

As shown in FIG. 4G, an insulating material layer 150 is deposited over the whole surface of the substrate 110 to cover the auxiliary electrodes 145 in order to prevent the auxiliary electrodes 145 from being short-circuited. Preferably, the insulating material layer 150 is patterned in the form of the same shape as the light absorbing layer 120 to form an insulating layer 155 using either of the pattern masks of FIGS. 2A and 2B, as shown in FIG. 4H. In other words, FIG. 4H shows the insulating layer 155 having the same shape as the light absorbing layer 45 of FIG. 2B, but the insulating layer 155 may has the same shape as the light absorbing layer 45' of FIG. 3B. An opening portion 157 of the insulating layer 155 is formed at a location corresponding to the opening portion 127 of the light absorbing layer 125, and an insulating piece 159 of the insulating layer 155 is formed at a location corresponding to the light absorbing piece 129 of the light absorbing layer 155.

Figure 4I:
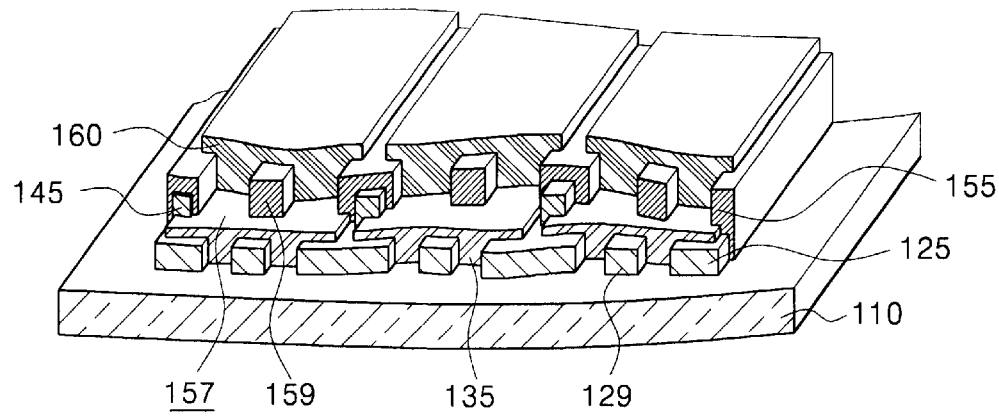

Thereafter, as shown in FIG. 4I, light-emitting layers 160 are formed on the anode electrodes 125 to cover the opening portions 157 using the pattern mask. The light-emitting layers 160 include a hole transport layer, a luminescent layer, and an electron transport layer, which are laminated in sequence.

Figure 4J:
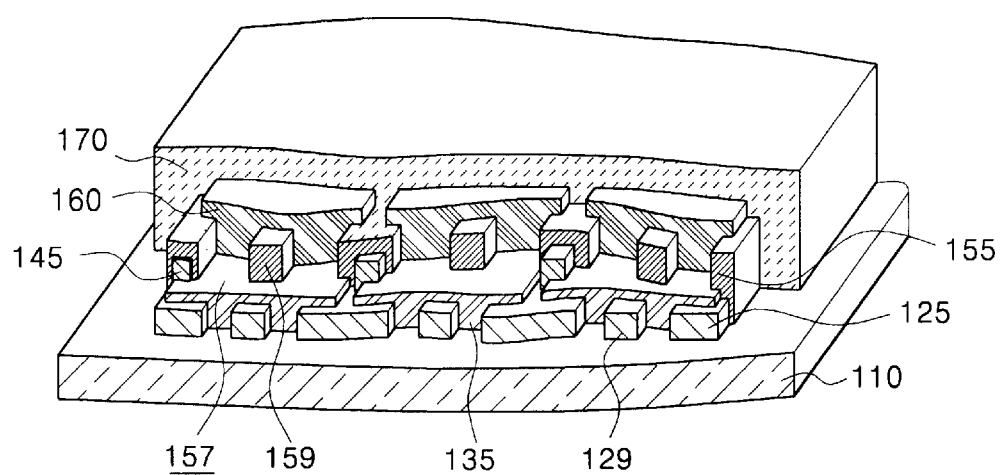

Finally, as shown in FIG. 4J, cathode electrodes 170 are formed on the light-emitting layers 160 in a perpendicular direction to the anode electrodes 135. Therefore, most components of the inventive organic EL device are completed.

Like the first preferred embodiment of the present invention, the organic EL device according to the second preferred embodiment of the present invention can improve brightness and achieve low power consumption.

Third Preferred Embodiment

Figure 5A:
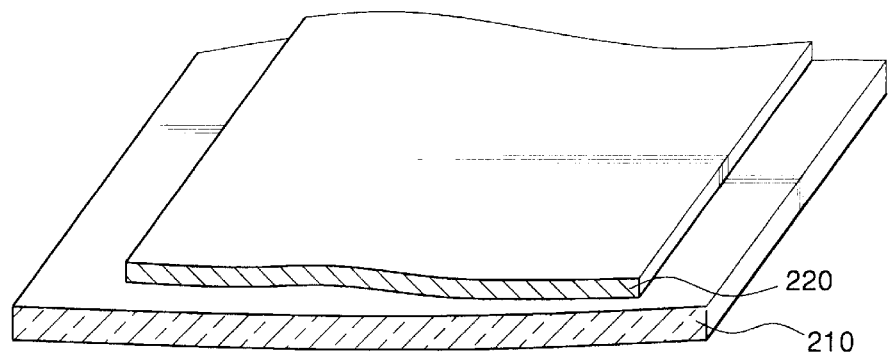
FIGS. 5A, 5B, 5C, 5D, 5E, 5F, 5G and 5H are schematic diagrams illustrating a process of manufacturing an organic EL device according to a third preferred embodiment of the present invention.
Figure 5B:
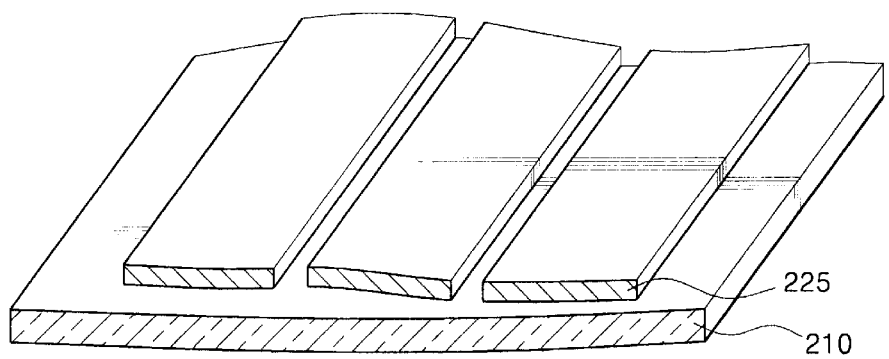

FIGS. 5A through 5H are schematic diagrams illustrating a process of manufacturing an organic EL device according to a third preferred embodiment of the present invention. First, as shown in FIG. 5A, a transparent conductive material layer 220 is deposited on a transparent substrate 210 to a predetermined thickness. The transparent conductive material layer 220 is patterned to form anode electrodes 225 in the form of a stripe as shown in FIG. 5B.

Figure 5C:
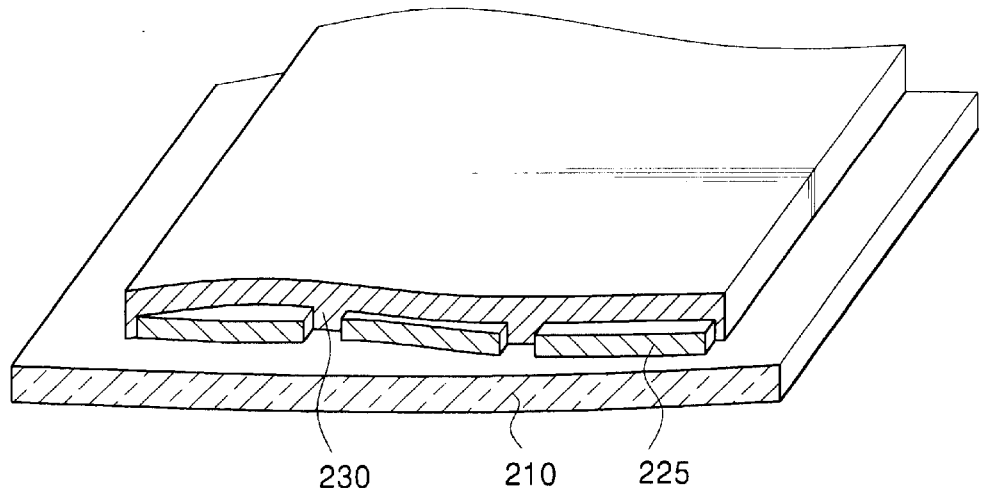
Figure 5D:
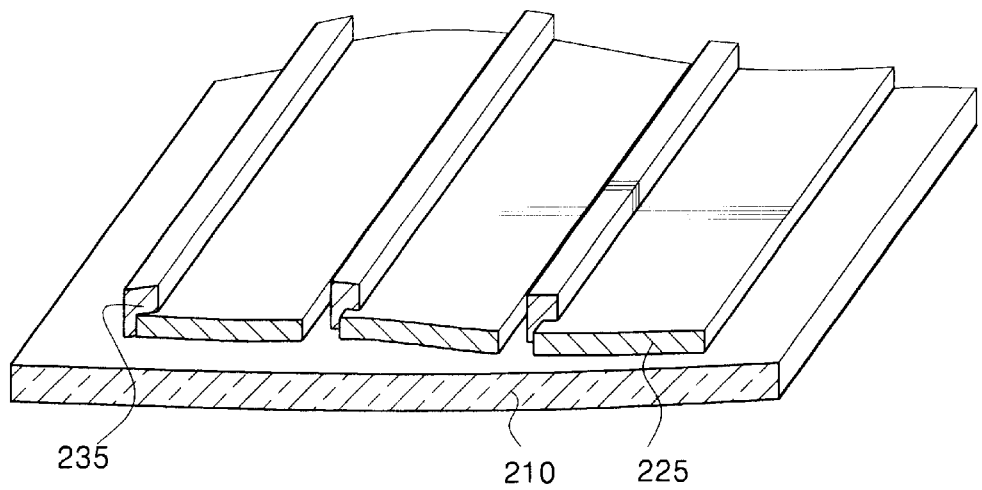

A metal layer 230 is deposited over the whole surface of the substrate 210 to a predetermined thickness to cover the anode electrodes 225 as shown in FIG. 5C. The metal layer 230 is patterned to form auxiliary electrodes 235 on one side of and in a longitudinal direction of the anode electrodes 225 as shown in FIG. 5D.

Figure 5E:
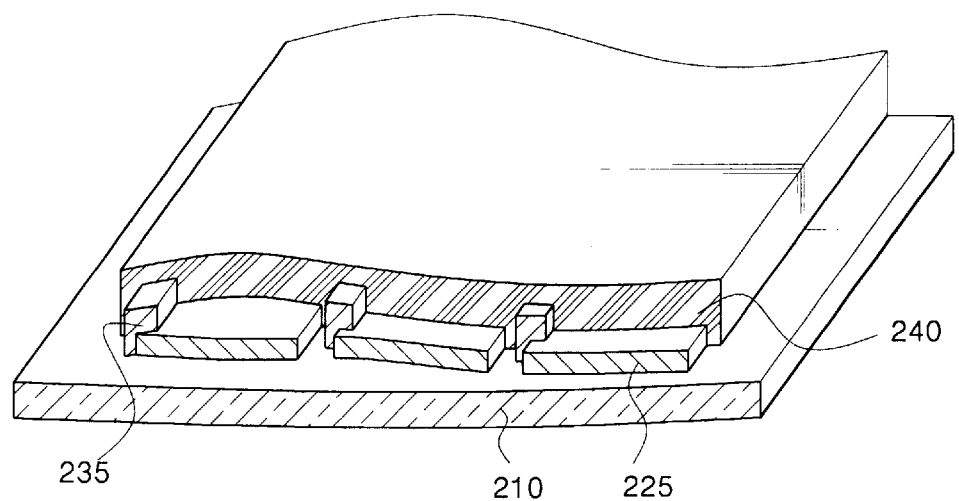
Figure 5F:
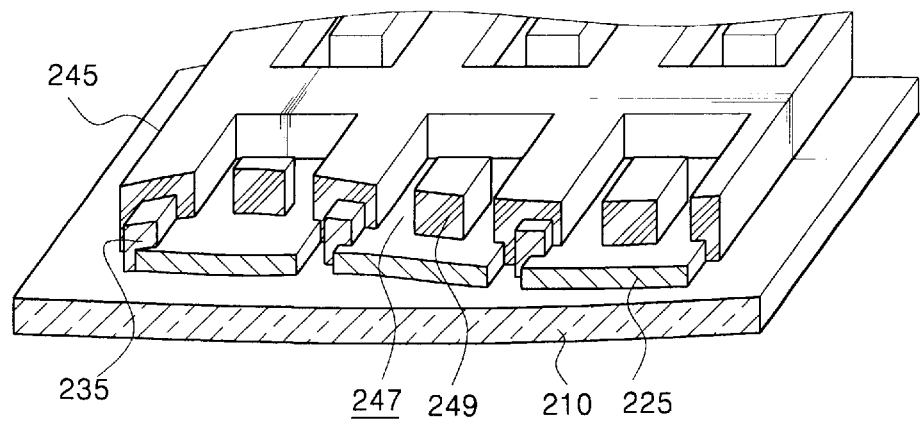

An insulating material layer 240 is deposited over the whole surface of the substrate 210 to cover the anode electrodes 225 and the auxiliary electrodes 235 as shown in FIG. 5E. The insulating material layer 240 is patterned to form an insulating layer 245 using either of the pattern masks 70 and 80 as shown in FIG. 5F. The insulating layer 245 has the same shape as either of the light absorbing layer 45 of FIG. 2B and the light absorbing layer 45' of FIG. 3B, even though FIG. 5F shows the insulating layer 245 having the same shape as the light absorbing layer 45 of FIG. 2B. That is, the light absorbing layer 45 of FIG. 5F includes an opening portion 247 and only one insulating piece 249, but the insulating layer 245 may have the same shape as the light absorbing layer 45' of FIG. 3B. An opening portion 247 of the insulating layer 245 is formed at a location corresponding to an light-emitting layer that will be formed in subsequent process.

Figure 5G:
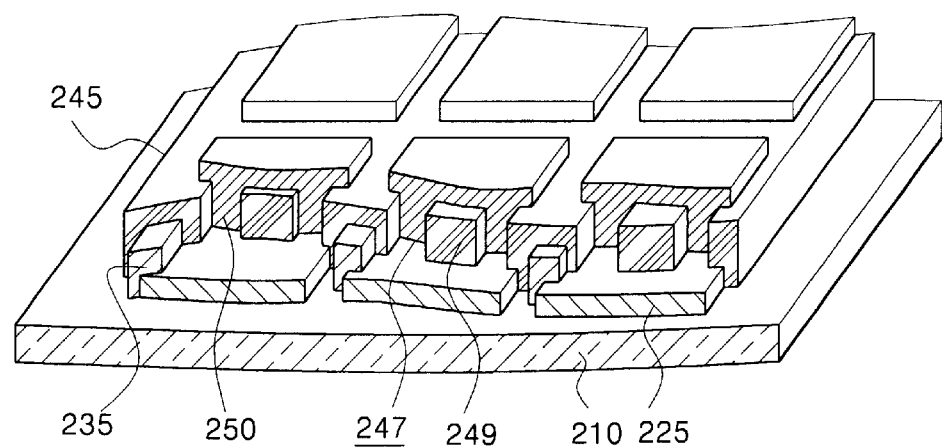
Figure 5H:
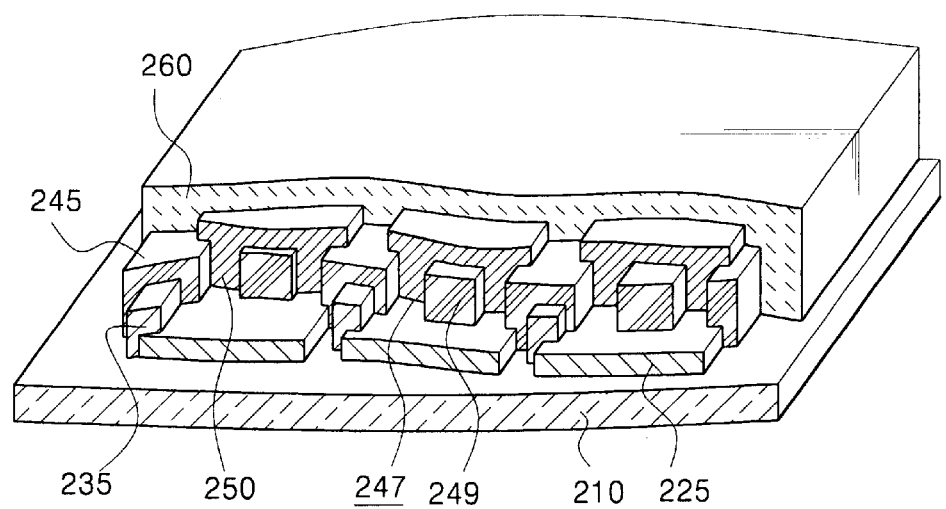

Subsequently, as shown in FIG. 5G, light-emitting layers 250 are formed on the anode electrodes 225 to cover the opening portions 247 of the insulating layer 245 using a pattern mask. The light-emitting layer 250 includes a hole transport layer, a luminescent layer, and an electron transport layer, which are laminated in sequence. As shown in FIG. 5H, cathode electrodes 260 are formed on the light-emitting layer 250 in a perpendicular direction to the anode electrodes 225.

Meanwhile, the organic EL device formed above, as shown in Table 1, has high reflectance and thus has too low contrast ratio of about 6.2:1 to implement clear display images.

Figure 6:
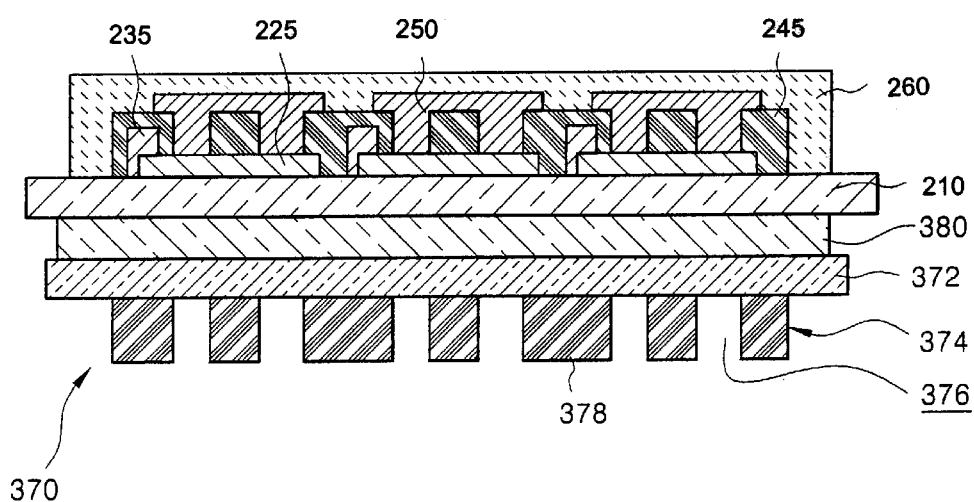
FIG. 6 is a cross-sectional view illustrating the organic EL device constructed according to the third preferred embodiment of the present invention.

In order to overcome such a problem, as shown in FIG. 6, a light absorbing unit 370 is attached on a display surface of the organic EL device via, for example, a bonding agent 380.

Figure 7A:
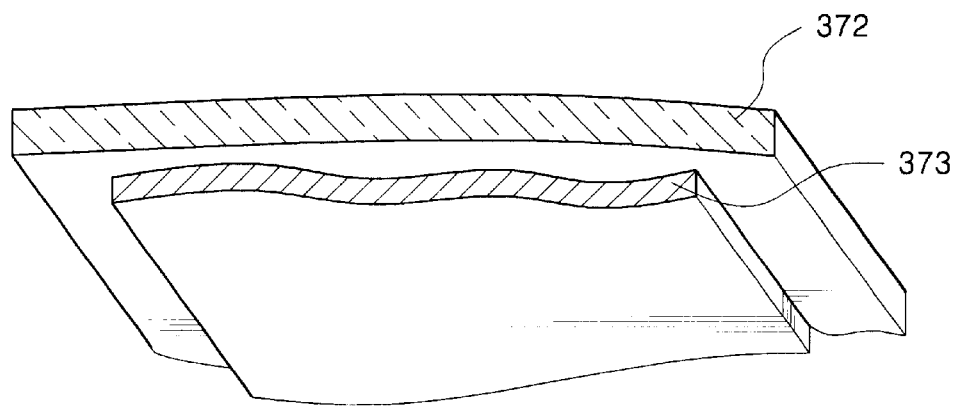
FIGS. 7A, 7B and 7C are perspective views illustrating a process of manufacturing a light absorbing unit according to the third preferred embodiment of the present invention.
Figure 7B:
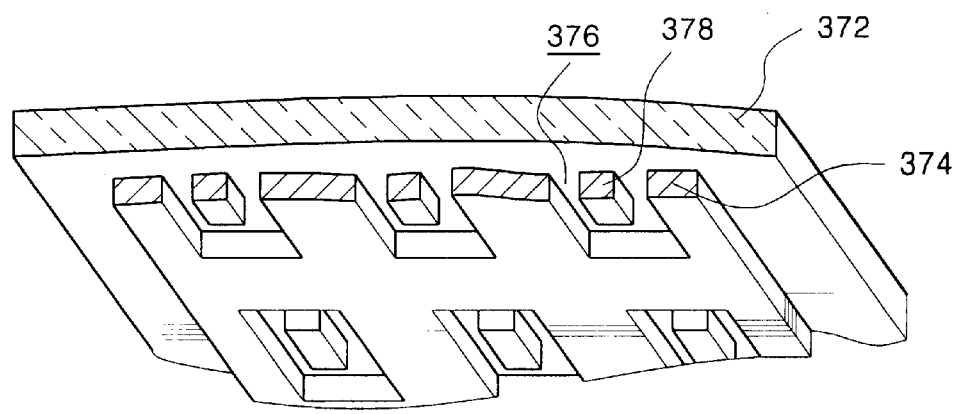
Figure 7C:
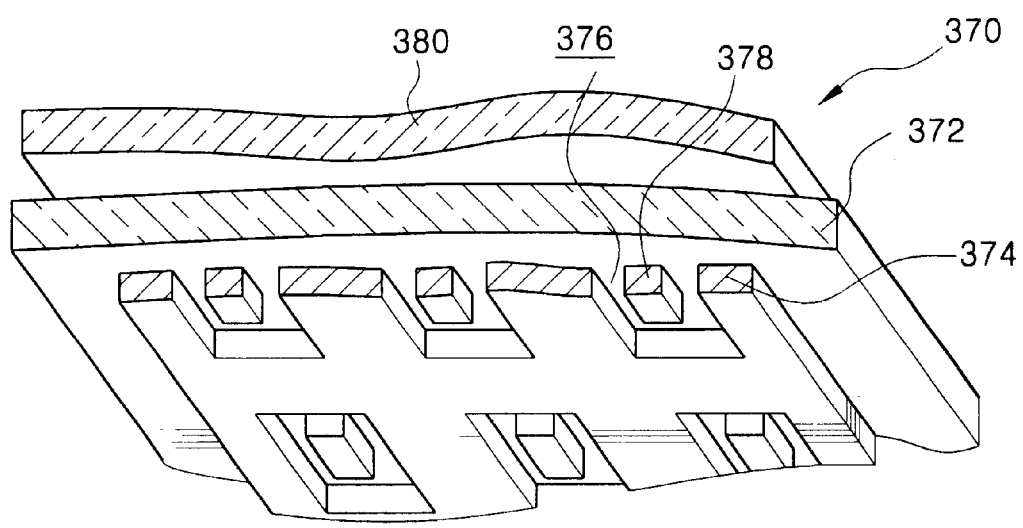

FIGS. 7A, 7B and 7C show a process of manufacturing the light absorbing unit 370. First, as shown in FIG. 7A, a light absorbing material layer 373 is deposited on a transparent substrate 372. As shown in FIG. 7B, the light absorbing material layer 373 is patterned to form a light absorbing layer 374 using either of the pattern masks of FIGS. 2A and 3A. The light absorbing layer 374 has the same shape as either of the light absorbing layer 45 of FIG. 2B and the light absorbing layer 45' of FIG. 3B. In other words, even though FIG. 7B shows the light absorbing layer 374 having the same shape as the light absorbing layer 45 of FIG. 2B, the light absorbing layer 374 may have the same shape as the light absorbing layer of FIG. 3B. The opening portion 376 of the light absorbing layer 374 is formed at a location corresponding to the opening portion 247 of the insulating layer 240, and the light absorbing piece 378 is formed at a location corresponding to the insulating piece 249.

The transparent substrate 372 can be made of one of transparent synthetic resins or glass. The light absorbing layer 374 should not be conductive. That is, the light absorbing layer 374 may be made of a non-conductive material. The opening portion 376 of the light absorbing layer 374 may be formed using not only the photolithography process but also a precise screen printing technique.

The light absorbing unit 370 formed above is attached on a display surface of the organic EL device. Therefore, most components of the inventive organic EL device are completed.

The organic EL device according to the third preferred embodiment of the present invention has high brightness and low power consumption.

Fourth Preferred Embodiment

Figure 8A:
FIGS. 8A, 8B, 8C, 8D, 8E, 8F, 8G, 8H, 8I, 8J, 8K, 8L and 8M are schematic diagrams illustrating a process of manufacturing an organic EL device according to a fourth preferred embodiment of the present invention.
Figure 8B:
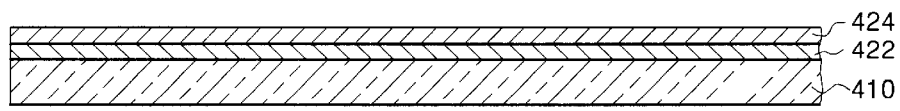
Figure 8C:
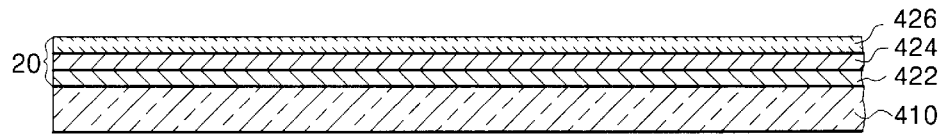

FIGS. 8A through 8M are schematic diagrams illustrating a process of manufacturing an organic EL device according to a fourth preferred embodiment of the present invention. First, as shown in FIGS. 8A, 8B and 8C, a non-conductive chromium oxide layer 422, a conductive chromium layer 424 and a non-conductive chromium oxide layer 426 are sequentially deposited on a transparent substrate 410.

In the meantime, in order to enable the organic EL device to have a resolution of, for example, 1024×768, 1024×768×3 number of the unit light-emitting elements should be arranged in the form of a matrix. After determining the number of the light-emitting element, arrangement conditions such as an interval and a size of the light emitting elements are also temporarily determined.

Figure 8D:
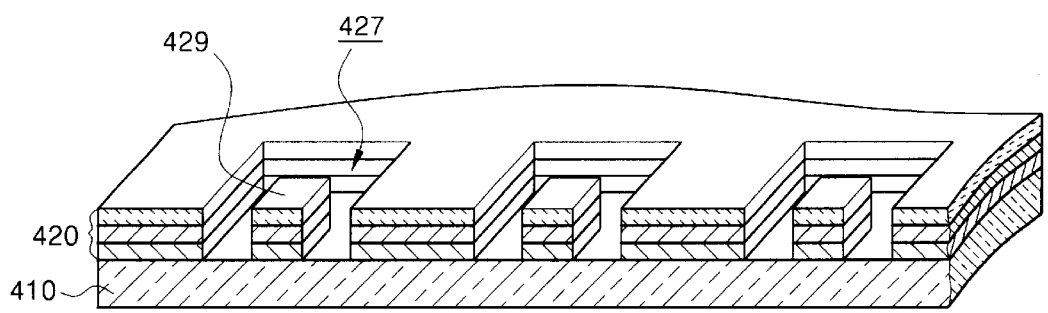
Figure 8E:
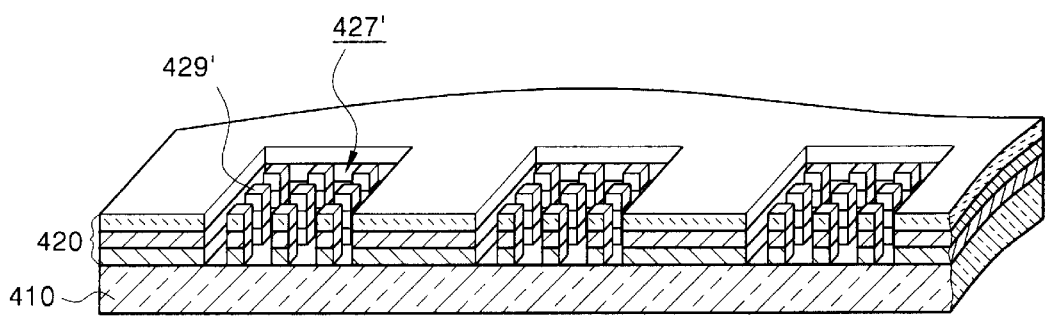

After determining arrangement conditions of the light-emitting elements, as shown in FIGS. 8D and 8E, the non-conductive chromium oxide layer 422, the conductive chromium layer 424 and the non-conductive chromium oxide layer 426 are simultaneously patterned to form a light absorbing layer 420 using either the pattern mask 70 of FIG. 2A or the pattern mask 80 of FIG. 3A. A shape of the light absorbing layer is very important because it greatly affects brightness and power consumption characteristics. The light absorbing layer 420 of FIG. 8D includes an opening portion 427 of a doughnut shape and one light absorbing piece 429 arranged in the opening portion 427. The light absorbing layer 420 of 8E includes an opening portion 427' of a grid shape and two or more light absorbing pieces 429' arranged in the opening portions 427'.

The light absorbing layer 420 including the non-conductive chromium oxide layer 422, the conductive chromium layer 424 and the non-conductive chromium oxide layer 426 absorbs so much ambient incident light, preferably, to about 100%. Thus, ambient light may not be reflected toward an observer, thereby improving a brightness.

Also, a shape of the opening portions 427 and 427' of the light absorbing layer 420 serves to cause an optical illusion so that an observer may not recognize an existence of the light absorbing piece 429'.

Figure 8F:
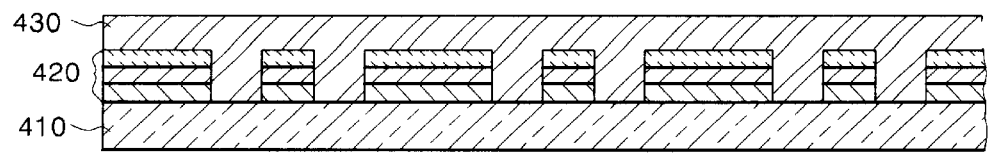
Figure 8G:
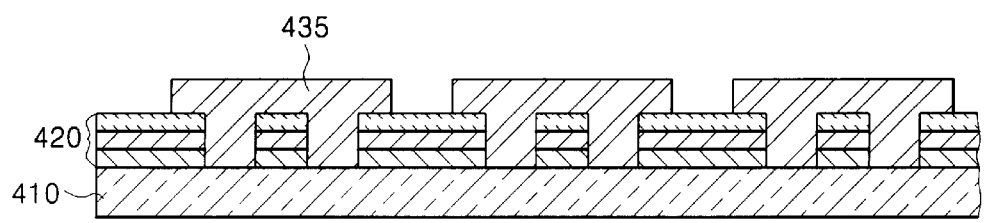

Subsequently, as shown in FIG. 8F, a transparent conductive material layer 430 is deposited over the whole surface of the substrate 410 to a predetermined thickness to cover the light absorbing layer 420. The transparent conductive material layer 430 is patterned to form strip-shaped anode electrodes 435 as shown in FIG. 8G. The anode electrodes 435 cover the opening portion 427 or 427' of the light absorbing layer 420. Preferably, the transparent conductive material layer 430 is made of one of ITO and IZO.

Figure 8H:
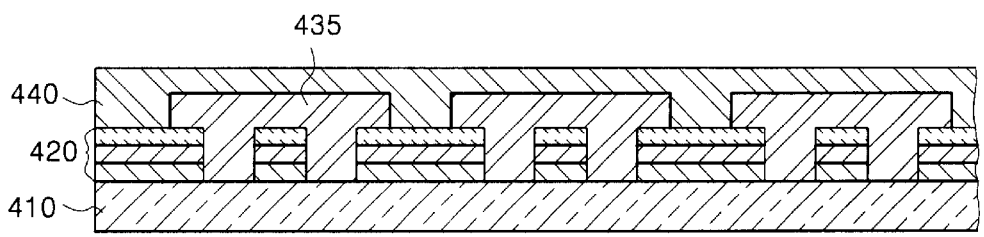
Figure 8I:
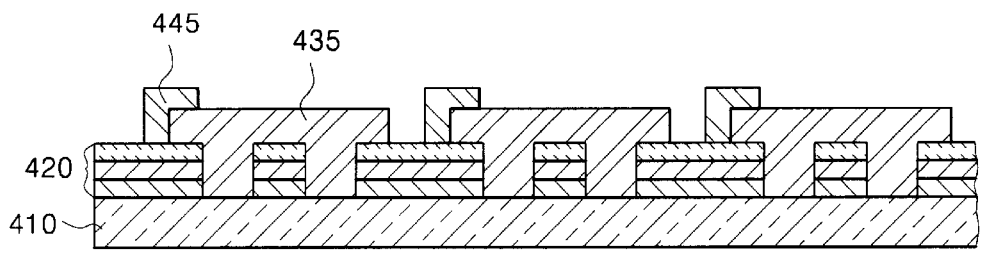

Then, a pad metal layer 440 is deposited over the whole surface of the substrate 410 to cover the anode electrodes 435 as shown in FIG. 8H and is patterned to form auxiliary electrodes 445 on one side of the anode electrodes and in a longitudinal direction of the anode electrode 435 as shown in FIG. 8I. The auxiliary electrodes 445 have a relatively low resistance and thus support the anode electrodes 435 having relatively bad electrical characteristics.

Figure 8J:
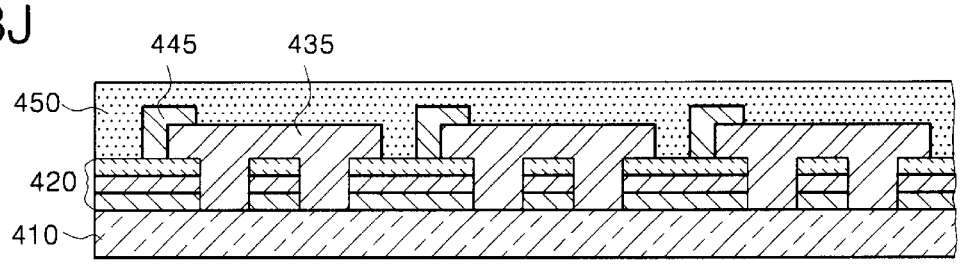
Figure 8K:
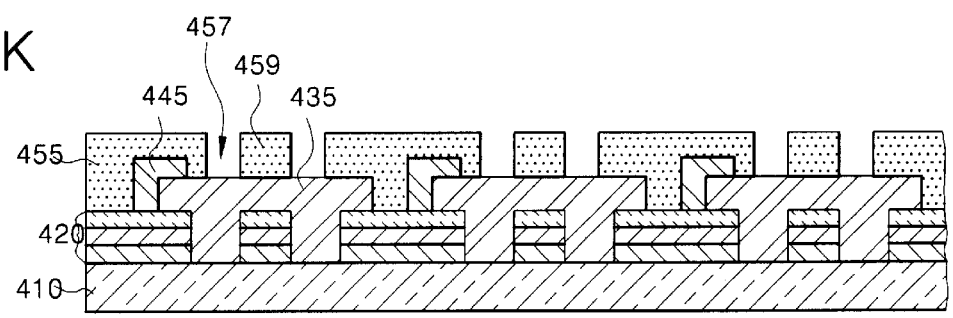

Next, an insulating material layer 450 is deposited over the whole surface of the substrate 10 as shown in FIG. 8J and patterned to form an insulating layer 455 as shown in FIG. 8K. The insulating layer 455 has the same shape as either of the light absorbing layer 420 of FIG. 8D or of the light absorbing layer 420 of FIG. 8E. In other words, the insulating layer 455 of FIG. 8K includes an opening portion 457 and one insulating piece 459, but the insulating layer 455 may include two or more insulating pieces in an opening portion. The opening portion 457 of the insulating layer 450 is formed at a location corresponding to the opening portion 427 of the light absorbing layer 420, and the insulating pieces are formed at a location corresponding to the light absorbing pieces 429 of the light absorbing layer 420. The insulating layer 455 prevents a short circuit of the pad metal layers 445, and light-emitting layers and cathode electrodes, which will be formed in subsequent process.

Figure 8L:
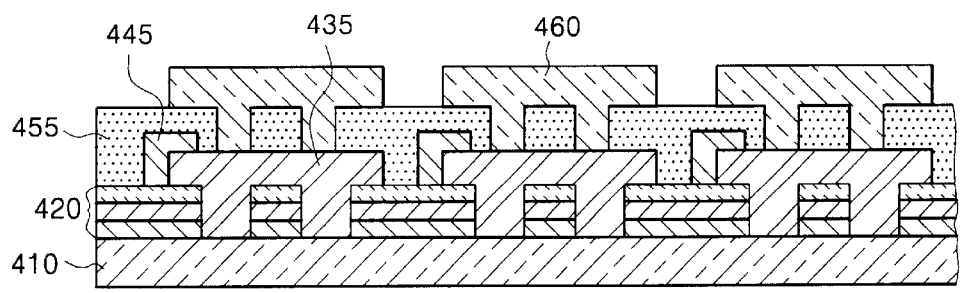
Figure 8M:
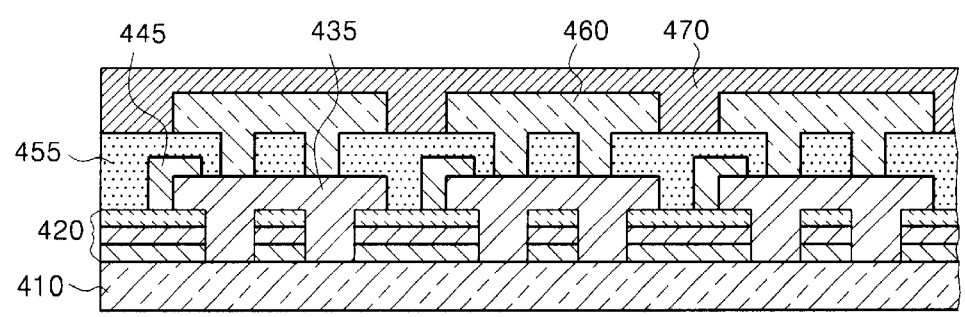

Thereafter, as shown in FIG. 8L, light-emitting layers 460 are formed on the anode electrodes 435 to cover the opening portion 457 of the insulating layer 445 to a predetermined thickness. Next, as shown in FIG. 8M, cathode electrodes 470 are formed on the light-emitting layers 460 in a perpendicular direction to the anode electrodes 435. Therefore, most components of the organic EL device according to the fourth preferred embodiment of the present invention are completed.

Fifth Preferred Embodiment

In the organic EL device according to the fourth preferred embodiment of the present invention, the insulating layer 455 must be arranged to prevent a short circuit between the pad metal layer 445 and the light-emitting layer 460, leading to a complicated manufacturing process. The complicated manufacturing process results in a low productivity. Therefore, in order to improve the productivity, a fifth preferred embodiment of the present invention provides an organic EL device that uses a portion of the light absorbing layer as an insulating layer.

Figure 9A:
FIGS. 9A, 9B, 9C, 9D, 9E, 9F, 9G, 9H, 9I, 9J, 9K and 9L are schematic diagrams illustrating a process of manufacturing the organic EL device according to a fifth preferred embodiment of the present invention.
Figure 9B:
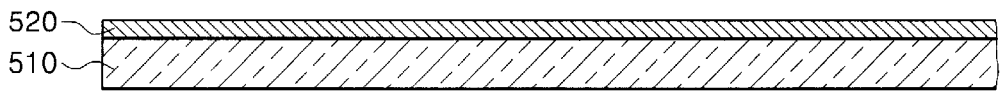
Figure 9C:
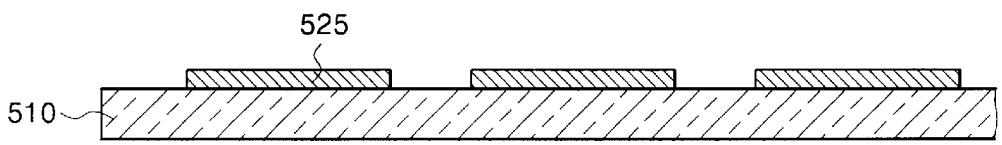

FIGS. 9A through 9L are schematic diagrams illustrating a process of manufacturing the organic EL device according to the fifth preferred embodiment of the present invention. First, as shown in FIGS. 9A and 9B, a transparent conductive material layer 520 is deposited on a transparent substrate 510. Preferably, the transparent conductive material layer is made of ITO or IZO. The transparent conductive material layer 520 is patterned to form anode electrodes 525 of a stripe shape, which are spaced apart from each other and arranged in parallel, as shown in FIG. 9C.

Figure 9D:
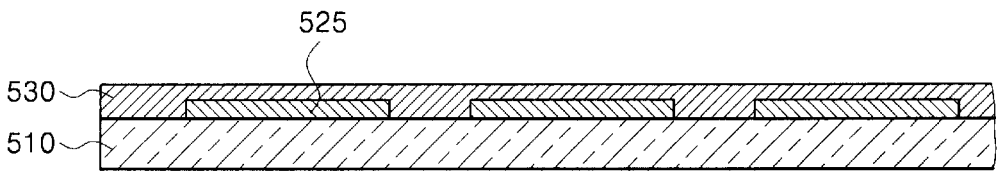
Figure 9E:
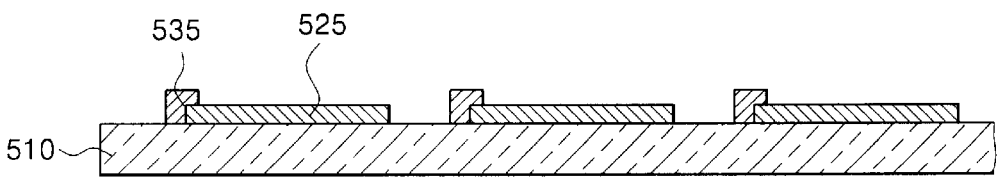

A pad metal layer 530 is deposited over the whole surface of the substrate 510 to cover the anode electrodes 525 as shown in FIG. 9D and is selectively etched to form auxiliary electrodes 535 on one side of the anode electrodes 525 and in a longitudinal direction of the anode electrodes 525 as shown in FIG. 9E.

Figure 9F:
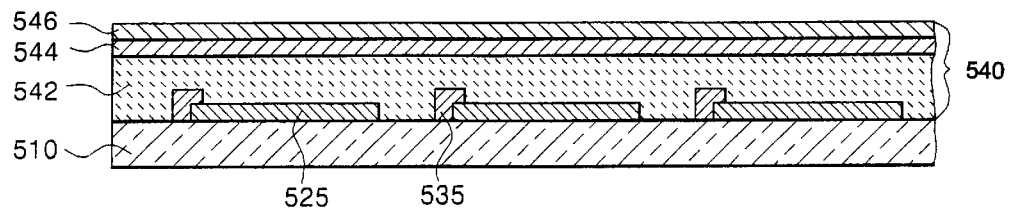
Figure 9G:
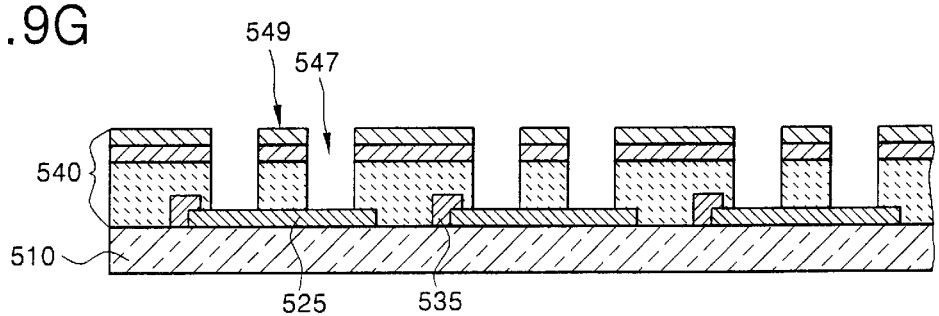
Figure 9H:
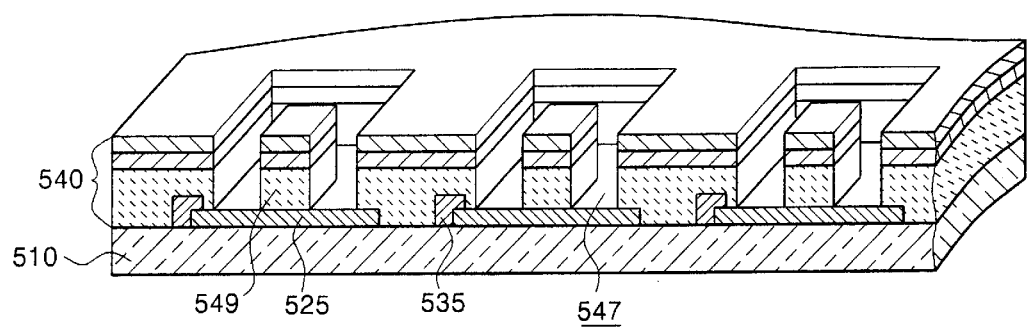
Figure 9I:
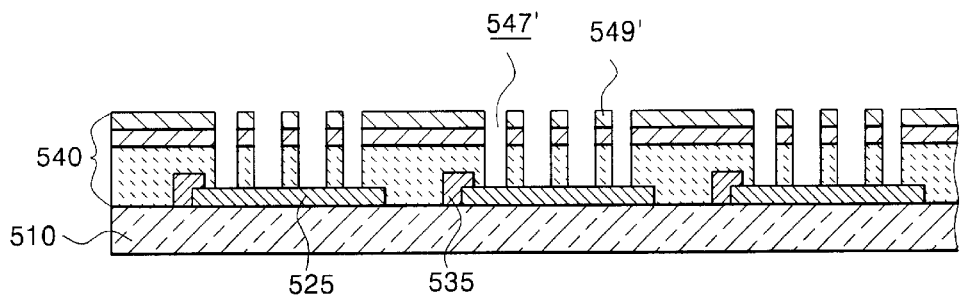
Figure 9J:
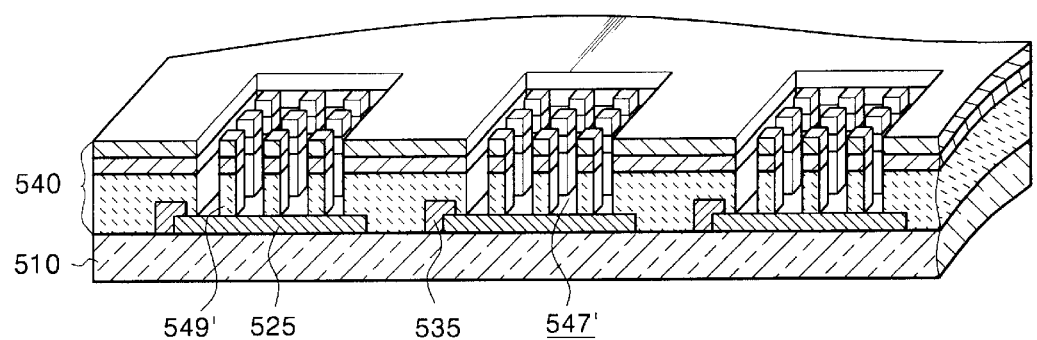

Subsequently, as shown in FIG. 9F, a non-conductive chromium oxide layer 542, a conductive chromium layer 544 and a non-conductive chromium oxide layer 546 are sequentially deposited over the whole surface of the substrate 510 to cover the anode electrodes 525 and the auxiliary electrodes 535.

As shown in FIGS. 9G through 9J, the non-conductive chromium oxide layer 542, the conductive chromium layer 544 and the non-conductive chromium oxide layer 546 are simultaneously patterned using either the pattern mask 70 of FIG. 2A or the pattern mask 80 of FIG. 3B to form a light absorbing layer 540. The light absorbing layer 540 has the same shape as either of the light absorbing layer 45 of FIG. 2B and the light absorbing layer 45' of FIG. 3B. In other words, when the pattern mask 70 of FIG. 2A is used, the light absorbing layer 540 has the same shape as FIG. 2B. When the pattern mask 80 of FIG. 3A, the light absorbing layer 540 has the same shape as FIG. 3B. The light absorbing layer 540 of FIGS. 9G and 9H includes an opening portion 547 of a doughnut shape and one light absorbing piece 549. The light absorbing layer 540 of FIGS. 9I and 9J includes an opening portion 547' of a grid shape and two or more light absorbing pieces 549'. At this point, the opening portions 547 and 547' are formed at a location corresponding to light-emitting layers that will be formed in subsequent process.

Figure 9K:
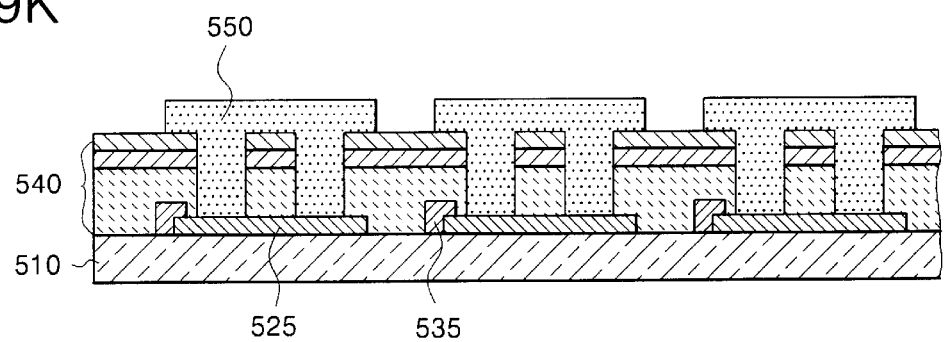

Subsequently, as shown in FIG. 9K, light-emitting layers 550 are formed on the anode electrodes 525 to cover the opening portions 540.

Figure 9L:
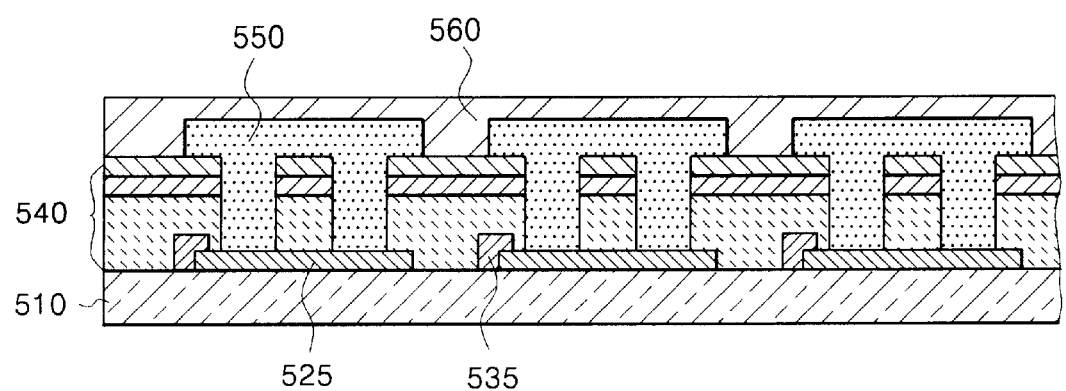

Finally, as shown in FIG. 9L, cathode electrodes 560 are formed on the light-emitting layers 550 in a perpendicular direction to the anode electrodes 525. Therefore, most components of the organic EL device according to the fifth preferred embodiment of the present invention are completed.

The organic EL device according to the fifth preferred embodiment of the present invention can improve the productivity because the light absorbing layer serves as the insulating layer, leading to high brightness and low power consumption.

Sixth Preferred Embodiment

Figure 10:
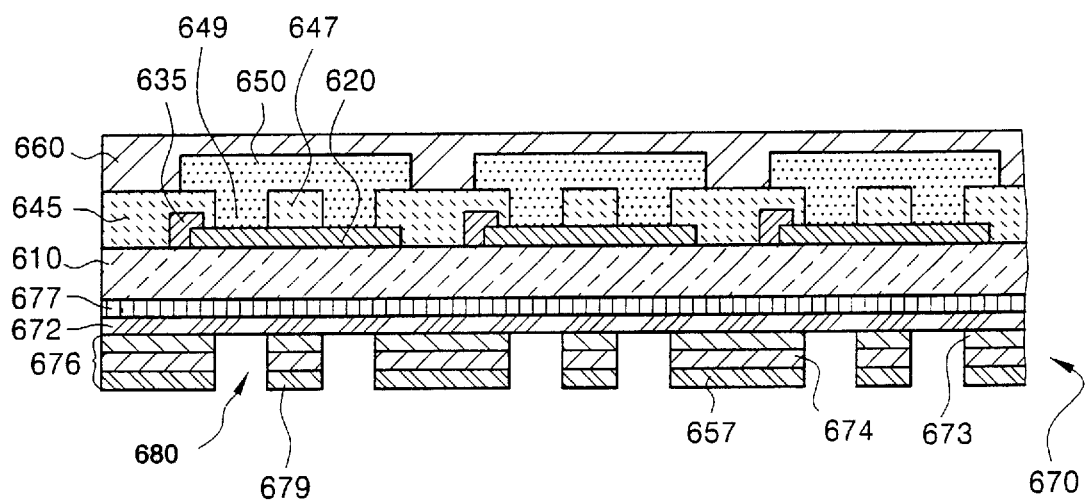
FIG. 10 is a cross-sectional view illustrating a configuration of an organic EL device according to a sixth preferred embodiment of the present invention.

FIG. 10 is a cross-sectional view illustrating a configuration of an organic EL device according to the sixth preferred embodiment of the present invention. Anode electrodes 620 are formed on a transparent substrate 610 in the form of a stripe. The anode electrodes 620 are spaced apart from and arranged parallel to each other. Pad metal layers or auxiliary electrodes 635 are formed on one side of the anode electrodes 620 and in a longitudinal direction of the anode electrodes 620. An insulating layer 645 is formed to overlap the auxiliary electrodes 635 and a portion of the anode electrodes is 620. At this point, the insulating layer 645 has the same shape as either the light absorbing layer 70 of FIG. 2A or the light absorbing layer 80 of FIG. 3A. In other words, even though FIG. 10 shows the insulating layer 645 having an opening portion 649 of a doughnut shape and one insulating piece 647, the insulating layer 645 may have an opening portion of a grid shape and two or more insulating pieces. Subsequently, light-emitting layers 650 are formed on the anode electrodes 620 to cover the opening portion 649. Thereafter, cathode electrodes 660 are formed on the light-emitting layers 650 in a perpendicular direction to the anode electrodes 620.

In addition, a light absorbing unit 670 is attached on a display surface of the organic EL device formed above using, for example, a bonding agent 677. The light absorbing unit 670 includes a transparent substrate 672 and a light absorbing layer 676. The light absorbing layer 676 includes a three-layered structure: a non-conductive chromium oxide layer 673; a conductive chromium layer 674; and a non-conductive chromium oxide layer 675. The light absorbing layer 676 has the same shape as the insulating layer 645. Thus, an opening portion 680 is formed at a location corresponding to the opening portion 649 of the insulating layer 645, and a light absorbing piece 679 is formed at a location corresponding to the insulating piece 649 of the insulating layer 645.

As a result, the organic EL device according to the sixth preferred embodiment of the present invention can achieve high brightness and low power consumption.

Seventh Preferred Embodiment

FIGS. 11A through 11K are schematic diagrams illustrating a process of manufacturing an organic EL device according to the seventh preferred embodiment of the present invention.

Figure 11A:
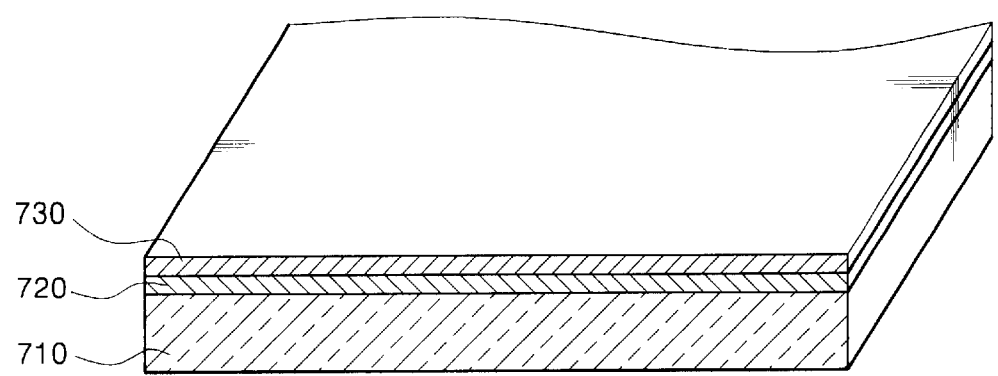
FIGS. 11A, 11B, 11C, 11D, 11E, 11F, 11G and 11H are schematic diagrams views illustrating a process of manufacturing an organic EL device according to a seventh preferred embodiment of the present invention.

First, as shown in FIG. 11A, a non-conductive chromium oxide layer 720 is deposited on a transparent substrate 710 to a thickness of about 500±100 Å, and then a conductive chromium layer 730 is deposited on the non-conductive chromium oxide layer 720 to a thickness of 1500±200 Å. The deposition process is performed using, for example, a sputtering technique.

Figure 11B:
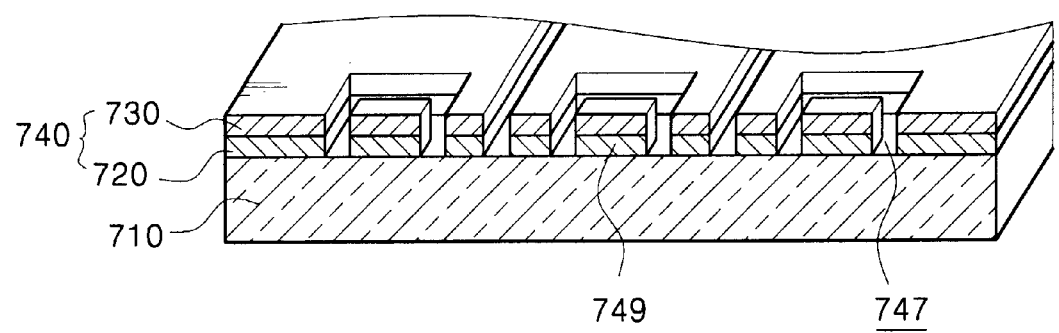

As shown in FIG. 11B, the non-conductive chromium oxide layer 720 and the conductive chromium layer 730 are simultaneously patterned to form a light absorbing layer 740 using either the pattern mask 70 of FIG. 2A or the pattern mask 80 of FIG. 3A through a photolithography process. The light absorbing layer 740 has the same shape as either the light absorbing layer 45 of FIG. 2B or the light absorbing layer 45' of FIG. 3B. In other words, even though FIG. 11B shows the light absorbing layer 740 having an opening portion 747 of a doughnut shape and one light absorbing piece 749, the light absorbing layer 740 may includes an opening portion of a grid shape and two or more light absorbing pieces. The opening portion 747 of the light absorbing layer 740 is formed at a location corresponding to the light-emitting layers that will be formed in subsequent process. It is preferable that the opening portion 747 has an aperture ratio of about 35.5%. At this point, the conductive chromium layer 730 acts as the conventional pad metal layer or auxiliary electrodes (see 635 in FIG. 10), enabling electrical current of the anode electrodes 755 having a relatively high resistance to smoothly flow.

Figure 11C:
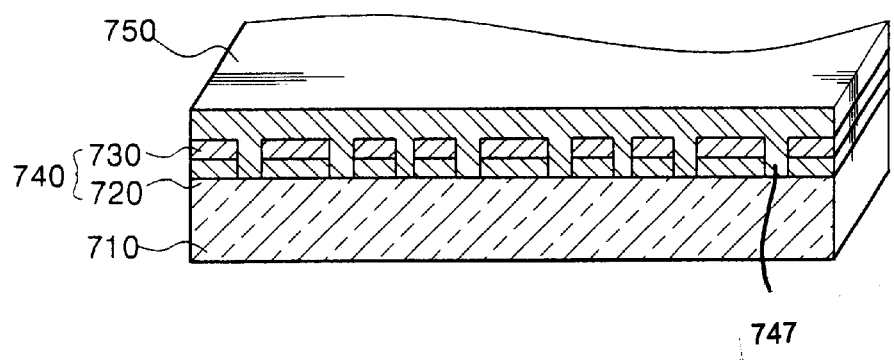

Subsequently, as shown in FIG. 11C, a transparent conductive material layer 750 is deposited over the whole surface of the substrate 710 to cover the opening portion 747 of the light absorbing layer 740. Preferably, the transparent conductive material layer 750 is made of ITO or IZO.

Figure 11D:
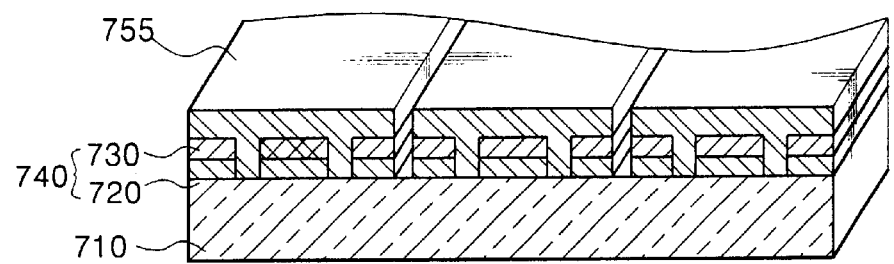

As shown in FIG. 11D, the transparent conductive material layer 750 is patterned to form stripe-shaped anode electrodes 755.

Figure 11E:
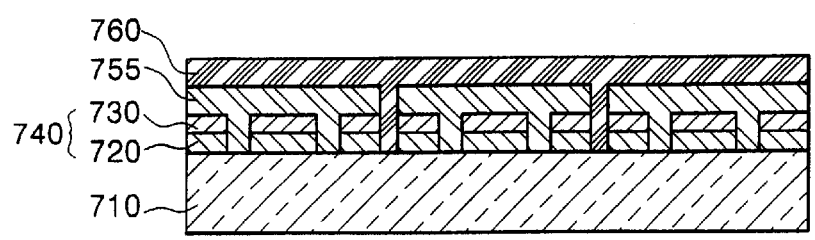
Figure 11F:
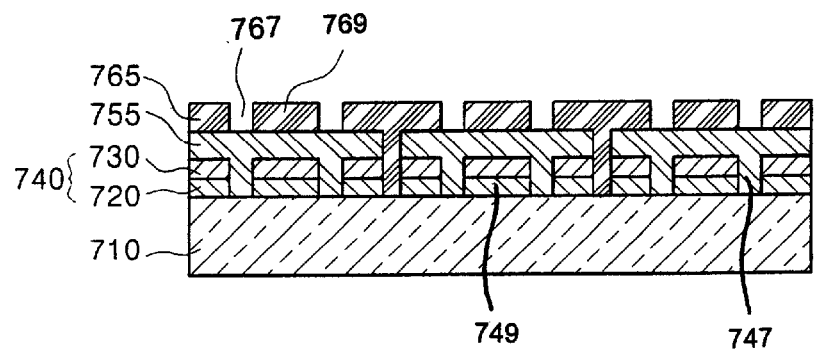

Subsequently, an insulating material layer 760 is deposited over the whole surface of the substrate 710 as shown in FIG. 11E and then is patterned to form an insulating layer 765 in a predetermined thickness as shown in FIG. 11F. The insulating layer 765 has the same shape as the light absorbing layer 740. An opening portion 767 of the insulating layer 765 is formed at a location corresponding to the opening portion 747 of the light absorbing layer 740, and an insulating piece 769 is formed at a location corresponding to the light absorbing piece 749 of the light absorbing layer 740.

Figure 11G:
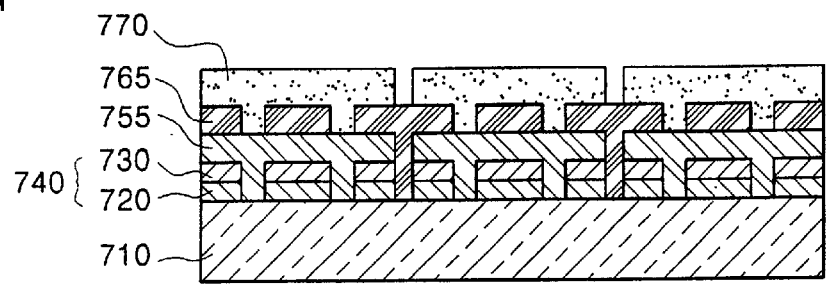

Thereafter, as shown in FIG. 11G, light-emitting layers 770 are formed on the anode electrodes 755 in a matrix form to cover the opening portion 767.

Figure 11H:
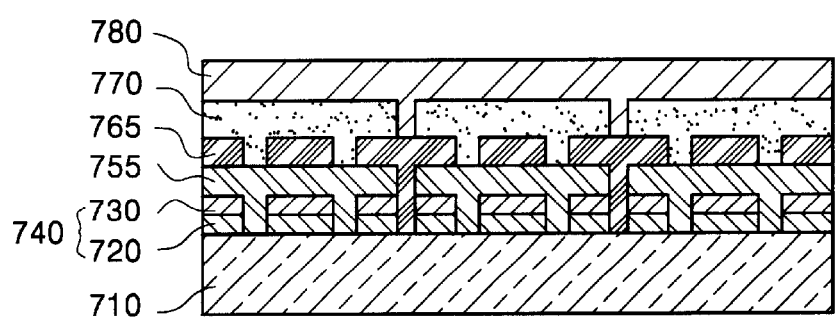

Finally, as shown in FIG. 11H, cathode electrodes 780 are formed on the light-emitting layers 770 in a perpendicular direction to the anode electrode 755. Therefore, most components of the organic EL device according to the seventh preferred embodiment of the present invention are completed.

In the meantime, in order to selectively improve the contrast ratio, an the anti-reflection coating layer may additionally be arranged to disperse light in connection with an outside of the substrate 710 or the anode electrode 755.

As described herein before, in the organic EL device according to the seventh preferred embodiment of the present invention, since the light absorbing layer 740 is under the anode electrodes 755, it can minimize the reflection of ambient light from the cathode electrodes 780, leading to a high brightness and low power consumption. Also, since the conductive chromium layer 730 of the light absorbing layer 740 serves as the conventional pad metal layer or auxiliary electrodes, the manufacturing process can be simplified.

Eighth Preferred Embodiment

Figure 12:
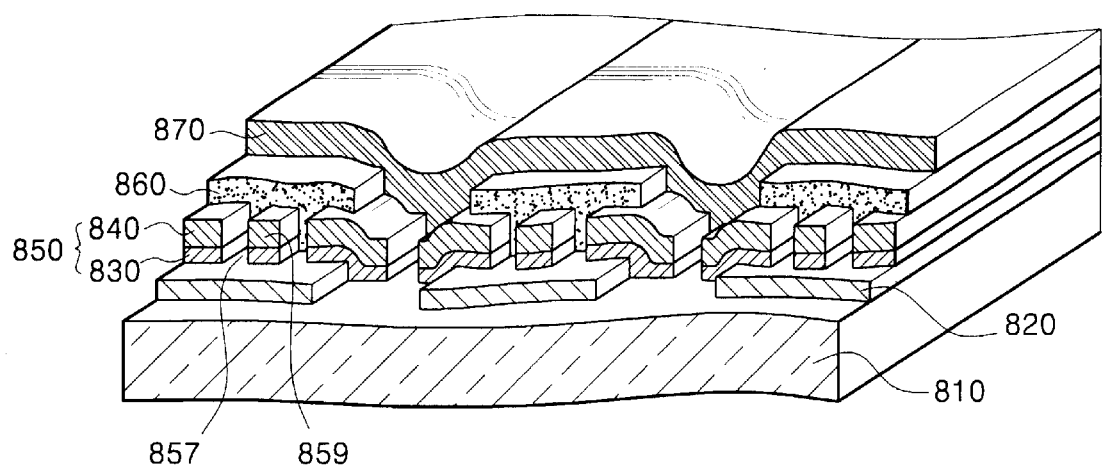
FIG. 12 is a cross-sectional view illustrating a configuration of an organic EL device according to an eighth preferred embodiment of the present invention.

FIG. 12 is a cross-sectional view illustrating a configuration of an organic EL device according to an eighth preferred embodiment of the present invention. First, a transparent conductive material layer is deposited on a transparent glass substrate 810. Preferably, the transparent conductive material layer is made of ITO or IZO. Thereafter, a photoresist layer is coated on the transparent conductive material layer to a predetermined thickness using, for example, a spin coating technique.

Subsequently, a pattern mask having a light shielding portion of a stripe shape is aligned with the substrate 810, and the photoresist layer is subject to light exposure to form stripe-shaped photoresist patterns. Then, the transparent conductive material layer is etched using a dry or a wet etching technique according to the photoresist patterns to form anode electrodes 820 spaced apart from each other in parallel.

Thereafter, a conductive chromium layer 830, a non-conductive chromium oxide layer 840 and a photoresist layer (not shown) are sequentially deposited over the whole surface of the substrate 810 to cover the anode electrodes 820. The photoresist layer is patterned to form photoresist patterns through the photolithography process using either the pattern mask 70 of FIG. 2A or the pattern mask 80 of FIG. 3A. The conductive chromium layer 830 and the non-conductive chromium oxide layer 840 are simultaneously patterned to form a light absorbing layer 850 according to the photoresist patterns. The light absorbing layer 850 has the same shape as either the light absorbing layer 45 of FIG. 2B or the light absorbing layer 45' of FIG. 3B. In other words, even though FIG. 12 shows the light absorbing layer 850 having an opening portion 857 of a doughnut shape and one light absorbing piece 859, the light absorbing layer 850 may have an opening portion of a grid shape and two or more light absorbing pieces. The opening portion 857 is formed at a location corresponding to light-emitting layers that will be formed in subsequent process and has an aperture ratio of preferably about 35.5%. Also, the conductive chromium layer 830 of the light absorbing layer 850 serves as the conventional pad metal layer or auxiliary electrodes.

Then, light-emitting layers 860 are formed on the anode electrodes 820 in the form of a matrix to cover the opening portion 857 of the light absorbing layer 850. The light-emitting layers 860 include a hole transport layer, a luminescent layer, and an electron transport layer, which are laminated in sequence.

Next, partition walls are formed to prevent short-circuits between the light-emitting layers 860, and then cathode electrodes 870 are formed on the light-emitting layers 860 in a perpendicular direction to the anode electrodes 820.

As described herein before, in the organic EL device according to the eighth preferred embodiment of the present invention, since the light absorbing layer 850 is interposed between the anode electrodes 820 and the cathode electrodes 870, it can minimize the reflection of ambient light from the cathode electrodes 870, leading to a high brightness and low power consumption. Also, since the conductive chromium layer 830 of the light absorbing layer 850 serves as the conventional pad metal layer or auxiliary electrodes, the manufacturing process can be simplified.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An organic EL device, comprising:
   first electrodes formed on a transparent substrate and spaced apart from each other in parallel;
   a light absorbing layer with an opening portion exposing a portion of the first electrodes and at least one light absorbing piece arranged in the opening portion;
   light-emitting layers formed on the exposed portion of the first electrodes to cover the opening portion of the light absorbing layer; and
   second electrodes formed on the light-emitting layers in a perpendicular direction to the first electrodes.

2. The device of claim 1, further comprising, a metal layer formed on one side of the first electrodes and in a longitudinal direction of the first electrodes.

3. The device of claim 2, wherein the light absorbing layer has a dual-layered structure.

4. The device of claim 3, wherein the light absorbing layer includes a non-conductive material layer and a conductive material layer sequentially formed.

5. The device of claim 1, wherein the light absorbing layer has a dual-layered structure.

6. The device of claim 5, wherein the light absorbing layer includes a conductive material layer and a non-conductive material layer sequentially formed.

7. The device of claim 5, wherein the light absorbing layer includes a conductive chromium layer and a non-conductive chromium oxide layer sequentially formed.

8. The device of claim 2, wherein the light absorbing layer has a three-layered structure.

9. The device of claim 8, wherein the light absorbing layer includes a non-conductive material layer, a conductive material layer and a non-conductive material layer sequentially formed.

10. An organic EL device, comprising:
    a transparent substrate;
    a light absorbing layer having a first opening portion and at least one light absorbing piece arranged in the opening portion;
    first electrodes covering the opening portion of the light absorbing layer, spaced apart from and parallel to each other;
    an insulating layer having a second opening portion formed at a location corresponding to the first opening portion of the light absorbing layer and at least one insulating piece formed at a location corresponding to the light absorbing piece;
    light-emitting layers formed on the exposed portion of the first electrodes to cover the second opening portion; and
    second electrodes formed on the light-emitting layer in a perpendicular direction to the first electrodes.

11. The device of claim 10, wherein the light absorbing layer is made of a non-conductive black resin.

12. The device of claim 10, the light absorbing layer has a three-layered structure.

13. The device of claim 12, wherein the light absorbing layer includes a non-conductive material layer, a conductive material layer and a non-conductive material layer sequentially formed.

14. The device of claim 13, wherein the non-conductive material layer is made of chromium oxide and the conductive material layer is made of chromium.

15. An organic EL device, comprising:
    a transparent substrate;
    first electrodes formed on a top surface of the transparent substrate and spaced apart from each other in parallel;
    an insulating layer having a first opening portion for exposing a portion of the first electrodes and at least one insulating piece formed in the first opening portion;
    light-emitting layers formed on the exposed portion of the first electrodes to cover the first opening portion of the insulating layer;
    second electrodes formed on the light-emitting layer in a perpendicular direction to the first electrodes; and
    a light absorbing unit attached on a bottom surface of the transparent substrate and having a second opening portion formed at a location corresponding to the first opening portion of the insulating layer and at least one light absorbing piece formed at a location corresponding to the insulating piece of the insulating layer.

16. The device of claim 15, further comprising a metal layer formed on one side of the first electrodes and in a longitudinal direction of the first electrodes.

17. The device of claim 15, wherein the light abosorbing unit comprises:
    a second transparent substrate attached to the bottom surface of the first transparent substrate; and
    a light absorbing layer having the second opening portion and the light absorbing piece.

18. The device of claim 15, wherein the light absorbing layer has a dual-layered structure.

19. The device of claim 18, wherein the light absorbing layer includes a non-conductive chromium oxide layer and a conductive chromium layer sequentially formed.

20. The device of claim 15, wherein the light absorbing layer has a three-layered structure.

21. The device of claim 20, wherein the light absorbing layer includes a non-conductive chromium oxide layer, a conductive chromium layer and a non-conductive chromium oxide layer sequentially formed on the second transparent substrate.

* * * * *